United States Patent
Song et al.

(10) Patent No.: US 10,896,917 B2
(45) Date of Patent: *Jan. 19, 2021

(54) SEMICONDUCTOR DEVICE

(71) Applicant: Samsung Electronics Co., Ltd., Suwon-si (KR)

(72) Inventors: Min Sung Song, Osan-si (KR); Heung Jin Joo, Suwon-si (KR); Kwan Yong Kim, Uijeongbu-si (KR); Jin Woo Park, Gunpo-si (KR); Du Heon Song, Seoul (KR); He Jueng Lee, Suwon-si (KR); Myung Ho Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/722,155

(22) Filed: Dec. 20, 2019

(65) Prior Publication Data

US 2020/0127009 A1 Apr. 23, 2020

Related U.S. Application Data

(63) Continuation of application No. 16/138,416, filed on Sep. 21, 2018, now Pat. No. 10,529,736.

(30) Foreign Application Priority Data

Dec. 6, 2017 (KR) .................. 10-2017-0166984

(51) Int. Cl.
*H01L 27/1157* (2017.01)
*H01L 27/11582* (2017.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC .......... H01L 27/11582; H01L 27/1157; H01L 27/11573; G11C 16/08
See application file for complete search history.

(56) References Cited

U.S. PATENT DOCUMENTS

| 6,879,015 B2 | 4/2005 | Liang et al. |
| 7,169,685 B2 | 1/2007 | Connell et al. |

(Continued)

FOREIGN PATENT DOCUMENTS

| KR | 10-2010-0078775 A | 7/2010 |
| KR | 10-2016-0120510 A | 10/2016 |

*Primary Examiner* — Mark W Tornow
(74) *Attorney, Agent, or Firm* — Muir Patent Law, PLLC

(57) ABSTRACT

In some embodiments, 3-dimensional semiconductor memory device includes a semiconductor substrate extending horizontally in a first direction and a second direction crossing the first direction. A stacked memory cell array is formed on the semiconductor substrate. The memory device further includes a separation pattern including a plurality of separation lines extending in the first direction and arranged in the second direction, and dividing the stacked memory cell array into a plurality of memory cell structures extending in the first direction and arranged in the second direction. An upper insulating layer is formed above the plurality of memory cell structures and separation lines, and a passivation layer is formed above the upper insulating layer. The passivation layer includes a plurality of first regions having a first vertical thickness. A plurality of gap regions in the passivation layer are formed between the plurality of first regions. The plurality of first regions vertically overlap the plurality of memory cell structures, and the plurality of gap regions vertically overlap the plurality of separation lines.

20 Claims, 26 Drawing Sheets

(51) Int. Cl.
*H01L 27/11573* (2017.01)
*H01L 27/11565* (2017.01)
*H01L 27/11575* (2017.01)
*G11C 16/08* (2006.01)

(52) U.S. Cl.
CPC .. *H01L 27/11573* (2013.01); *H01L 27/11575* (2013.01); *G11C 16/08* (2013.01)

(56) References Cited

U.S. PATENT DOCUMENTS

| | | |
|---|---|---|
| 7,781,851 B2 | 8/2010 | Seo |
| 9,230,979 B1 | 1/2016 | Pachamuthu et al. |
| 9,312,270 B2 | 4/2016 | Jang et al. |
| 9,570,516 B2 | 2/2017 | Shepard |
| 9,673,214 B2 | 6/2017 | Hatano et al. |
| 10,529,736 B2 * | 1/2020 | Song ................ H01L 27/11565 |
| 2005/0064693 A1 | 3/2005 | Liu et al. |
| 2005/0230724 A1 | 10/2005 | Hsu |
| 2007/0052090 A1 | 3/2007 | Cho |
| 2013/0147022 A1 | 6/2013 | Yoon et al. |
| 2015/0155241 A1 | 6/2015 | Uzoh |
| 2015/0187706 A1 | 7/2015 | Yi et al. |
| 2016/0141419 A1 | 5/2016 | Baenninger et al. |
| 2016/0293556 A1 | 10/2016 | Uzoh |

* cited by examiner

SEMICONDUCTOR DEVICE

CROSS-REFERENCE TO RELATED APPLICATION

This application is a continuation application of U.S. patent application Ser. No. 16/138,416, filed Sep. 21, 2018, which claims the priority and benefit of Korean Patent Application No. 10-2017-0166984, filed on Dec. 6, 2017, with the Korean Intellectual Property Office, the entire contents of each of which are incorporated herein by reference.

BACKGROUND

Semiconductor devices have gradually been reduced in size while simultaneously being required to be able to process large amounts of data. Accordingly, a degree of integration of semiconductor devices has been increasing. As one method of improving the degree of integration of semiconductor devices, semiconductor devices having a vertical transistor structure, instead of an existing planar transistor structure, have been proposed. These types of semiconductor devices often suffer from warpage that occurs due to heating during the manufacturing process, which can be undesirable and can result in reliability issues.

SUMMARY

An aspect of the present inventive concept may provide a semiconductor device having controlled warpage and improved reliability.

In some embodiments, 3-dimensional semiconductor memory device includes a semiconductor substrate extending horizontally in a first direction and a second direction crossing the first direction. A stacked memory cell array is formed on the semiconductor substrate. The memory device further includes a separation pattern including a plurality of separation lines extending in the first direction and arranged in the second direction, and dividing the stacked memory cell array into a plurality of memory cell structures extending in the first direction and arranged in the second direction. An upper insulating layer is formed above the plurality of memory cell structures and separation lines, and a passivation layer is formed above the upper insulating layer. The passivation layer includes a plurality of first regions having a first vertical thickness. A plurality of gap regions in the passivation layer are formed between the plurality of first regions. The plurality of first regions vertically overlap the plurality of memory cell structures, and the plurality of gap regions vertically overlap the plurality of separation lines.

In some embodiments, which may include the above embodiment, a vertical NAND (VNAND) semiconductor device includes a semiconductor substrate, a plurality of gate electrode layers alternately formed with a plurality of interlayer insulating layers on the substrate in a vertical stack, and forming a plurality of gate stack structures extending in a first horizontal direction and separated from each other in a second horizontal direction perpendicular to the first direction, a plurality of vertical channels passing through each of the plurality of gate stack structures, wherein the plurality of vertical channels form transistor strings, a plurality of separation areas extending in the first direction and arranged in the second horizontal direction between the plurality of gate stack structures to separate the gate stack structures from each other, an upper insulating layer formed above the plurality of gate electrode layers, and a passivation layer formed above the upper insulating layer. The passivation layer includes a plurality of first regions having a first vertical thickness. A plurality of gap regions in the passivation layer are formed between the plurality of first regions. In addition, the plurality of first regions vertically overlap the plurality of gate stack structures, and the plurality of gap regions vertically overlap the plurality of separation areas.

In some embodiments, which may include the above embodiments, a vertical NAND (VNAND) semiconductor device includes a semiconductor substrate, a plurality of gate stack structures formed on the semiconductor substrate, the plurality of gate stack structures extending lengthwise in a first direction and separated from each other in a second direction perpendicular to the first direction, a plurality of vertical channels passing through each of the plurality of gate stack structures, wherein the plurality of vertical channels form transistor strings, a plurality of separation areas extending lengthwise in the first direction and arranged in the second direction between the plurality of gate stack structures to separate the gate stack structures from each other, an upper insulating layer formed above the plurality of gate stack structures, and a passivation layer formed above the upper insulating layer. The passivation layer includes a plurality of first line patterns extending in the first direction and having a first vertical thickness and includes a plurality of second line patterns having a second vertical thickness smaller than the first vertical thickness and extending in the first direction. The first line patterns are arranged to reduce warpage of the semiconductor device in the first direction and the first line patterns combined with the second line patterns are arranged to reduce warpage of the semiconductor device in the second direction.

In some embodiments, which may include the above embodiments, a vertical NAND (VNAND) semiconductor device includes a semiconductor substrate, a plurality of gate electrode layers alternately formed with a plurality of interlayer insulating layers on the substrate in a vertical stack, and forming a plurality of gate stack structures extending lengthwise in a first direction and separated from each other in a second direction perpendicular to the first direction, a plurality of vertical channels passing through each of the plurality of gate stack structures, wherein the plurality of vertical channels form transistor strings, a plurality of separation areas extending in the first direction and arranged in the second direction between the plurality of gate stack structures to separate the gate stack structures from each other, an upper insulating layer formed above the plurality of gate electrode layers, and a passivation layer formed above the upper insulating layer. The passivation layer includes a plurality of first regions having a first vertical thickness and a plurality of second regions having a second vertical thickness different from the first vertical thickness. The plurality of first regions extend in the first direction to cover the plurality of gate stack structures, and the plurality of second regions extend in the first direction to cover the plurality of separation areas, such that the plurality of first regions are arranged alternately with the plurality of second regions in the second direction.

In some embodiments, which may include the above embodiments, a method of manufacturing a 3-dimensional semiconductor memory device includes providing a semiconductor substrate extending horizontally in a first direction and a second direction crossing the first direction, forming a stacked memory cell array on the semiconductor substrate, forming a separation pattern including separation lines extending in the first direction and arranged in the second direction, the separation lines dividing the stacked memory cell array into a plurality of memory cell structures extending in the first direction and arranged in the second direction, forming an upper insulating layer above the plurality of memory cell structures and separation lines, forming a passivation layer above the upper insulating layer. The passivation layer includes a plurality of first regions having a first vertical thickness, a plurality of gap regions are formed in the passivation layer between the plurality of first regions, and the plurality of first regions vertically overlap the plurality of memory cell structures, and the plurality of gap regions vertically overlap the plurality of separation lines.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, various embodiments of the present inventive concept will be described with reference to the accompanying drawings.

Figure 1:
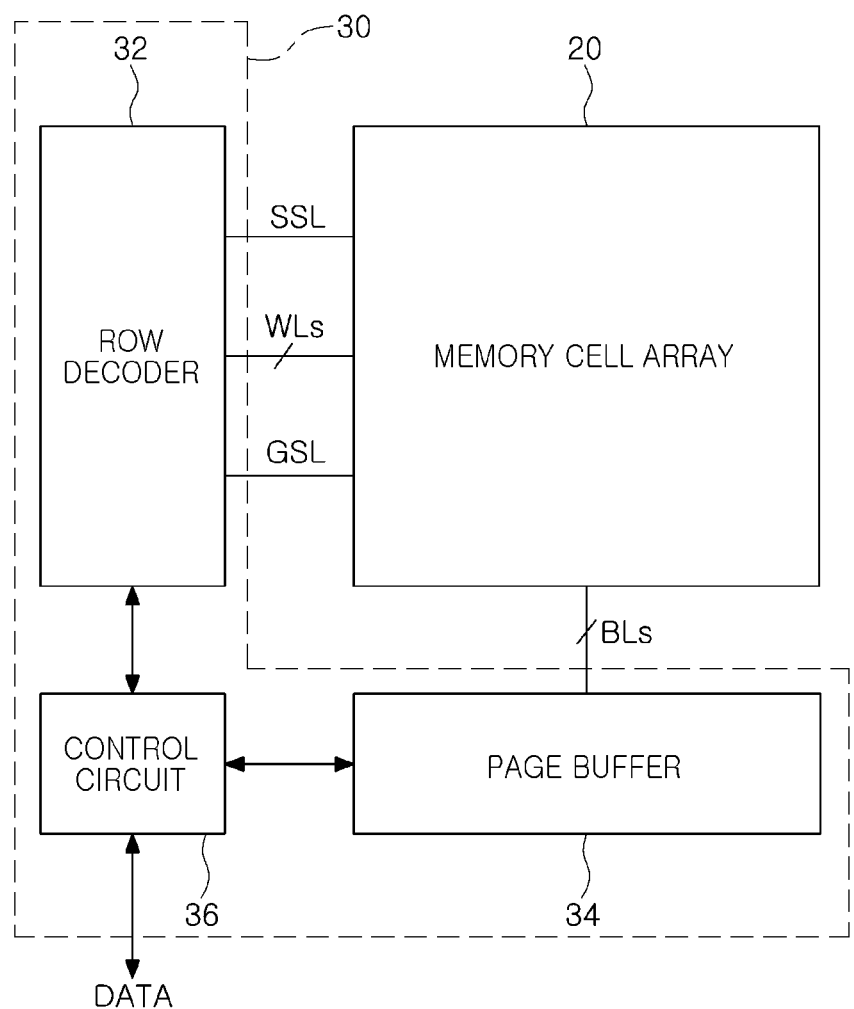
FIG. 1 is a schematic block diagram illustrating a semiconductor device according to example embodiments of the inventive concept.

FIG. 1 is a schematic block diagram illustrating a semiconductor device according to example embodiments of the present inventive concept.

Referring to FIG. 1, a semiconductor device 10 may include a memory cell array 20 and a control logic 30.

The memory cell array 20 may include a plurality of memory blocks, and each of the memory blocks may include a plurality of memory cells. The plurality of memory cells may be connected to a row decoder 32 via a string select line SSL, a plurality of word lines WLs, and a ground select line GSL, and to a page buffer 34 via bit lines BLs. In some example embodiments, a plurality of memory cells arranged in the same row may be connected to the same word line WL, and a plurality of memory cells arranged in the same column may be connected to the same bit line BL.

The control logic 30 may include the row decoder 32, the page buffer 34, and a control circuit 36.

The row decoder 32 may decode an input address, and generate and transmit driving signals of the word lines WL. The row decoder 32 may supply a word line voltage generated in a voltage generation circuit included in the control circuit 36 to a selected word line WL and unselected word lines WLs, in response to a control of the control circuit 36.

The page buffer 34 may be connected to the memory cell array 20 via the bit lines BLs to read information stored in the memory cells. The page buffer 34 may temporarily store data to be stored in the memory cells or may sense the data stored in the memory cells, depending on an operation mode. The page buffer 34 may include a column decoder and a sensing amplifier. The column decoder may selectively activate the bit lines BLs of the memory cell array 20. The sensing amplifier may sense a voltage of a bit line BL selected by the column decoder to read data stored in a selected memory cell, during a reading operation.

The control circuit 36 may control operations of the row decoder 32 and the page buffer 34. The control circuit 36 may receive an external control signal and an external voltage and operate according to the received control signal. The control circuit 36 may include the voltage generation circuit generating voltages, such as a programming voltage, a reading voltage, and an erasing voltage, necessary for an internal operation, using the external voltage. The control circuit 36 may control reading, writing, and/or erasing operations in response to the control signals. In addition, the control circuit 36 may include an input/output circuit. The input/output circuit may receive data DATA to be transmitted to the page buffer 34 during a programming operation, and output data DATA received from the page buffer 34 during a reading operation.

Figure 2:
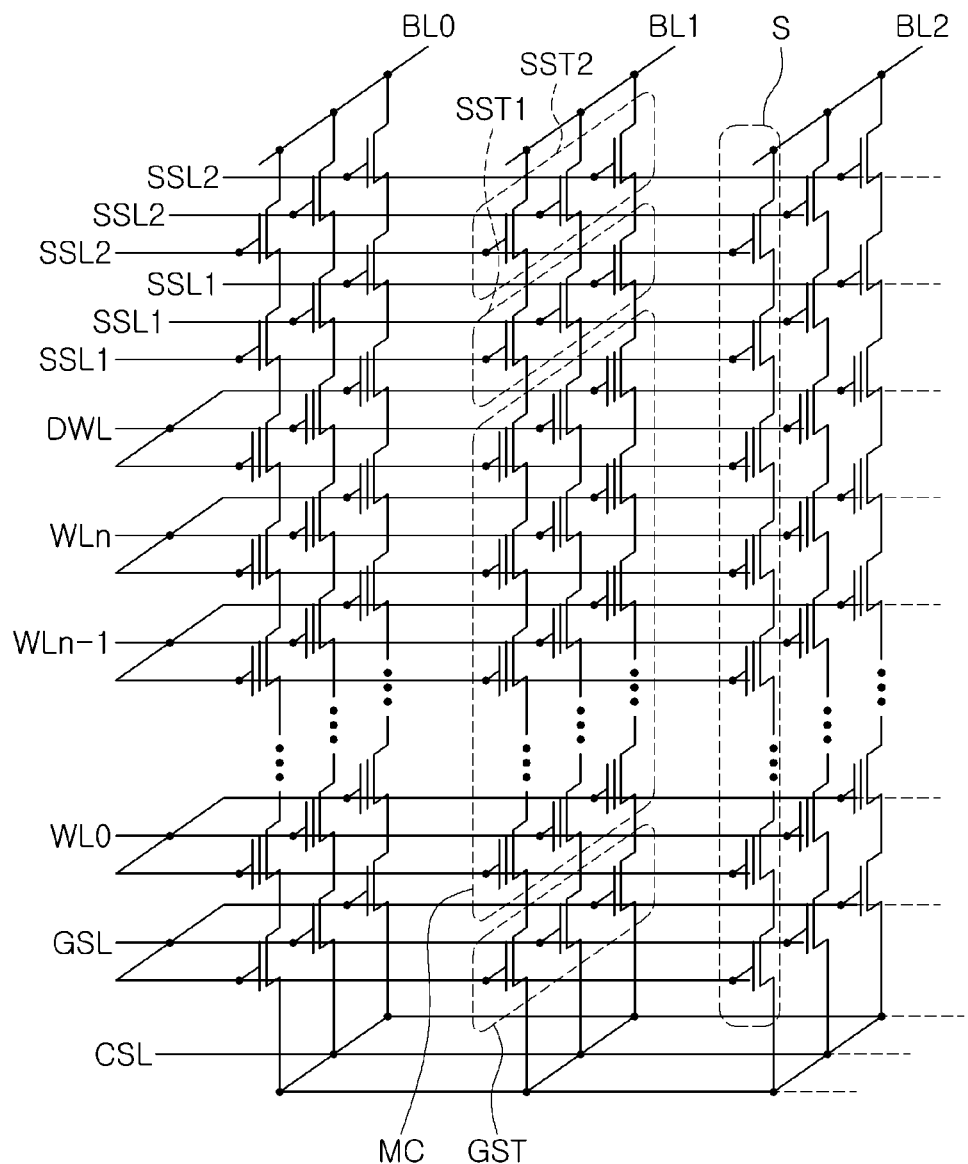
FIG. 2 is an equivalent circuit diagram illustrating a memory cell array of a semiconductor device according to example embodiments of the inventive concept.

FIG. 2 is an equivalent circuit diagram illustrating a memory cell array of a semiconductor device according to example embodiments of the present inventive concept. FIG. 2 is a conceptual circuit diagram provided to illustrate the memory cell array 20 of FIG. 1.

Referring to FIG. 2, the memory cell array 20 may include a plurality of memory cell strings S, each of which includes memory cells MC connected to each other in series, and a ground select transistor GST and string select transistors SST1 and SST2 respectively connected to both ends of the memory cells MC in series. The memory cells MC connected to each other in series may be respectively connected to n word lines WL0 to WLn for selecting the memory cells MC.

A gate terminal of the ground select transistor GST may be connected to a ground select line GSL, and a source terminal of the ground select transistor GST may be connected to a common source line CSL. Gate terminals of the string select transistors SST1 and SST2 may be respectively connected to string select lines SSL1 and SSL2, and source terminals of the string select transistors SST1 and SST2 may be connected to drain terminals of the memory cells MC. In FIG. 2, one ground select transistor GST and two string select transistors SST1 and SST2 are connected to the plurality of memory cells MC, connected to each other in series. However, a plurality of ground select transistors GST or one string select transistor SST may be connected to the memory cells MC. In some example embodiments, one or more dummy lines DWL or buffer lines may further be arranged between the uppermost word line WLn among the word lines WL0 to WLn and the string select line SSL.

Drain terminals of the string select transistors SST1 and SST2 may be connected to bit lines BL0 to BL2. When a signal is applied to the gate terminals of the string select transistors SST1 and SST2 via the string select lines SSL1 and SSL2, the signal applied via the bit lines BL0 to BL2 may be transmitted to the memory cells MC connected to each other in series, and thereby, a data reading or data writing operation may be performed. An erasing operation in which data written in the memory cells MC is removed may be performed by applying a predetermined erase voltage via a substrate. In some example embodiments, the semiconductor device may include at least one dummy string. The dummy string may be a string including dummy channels electrically isolated from the bit lines BL0 to BL2.

Figure 3:
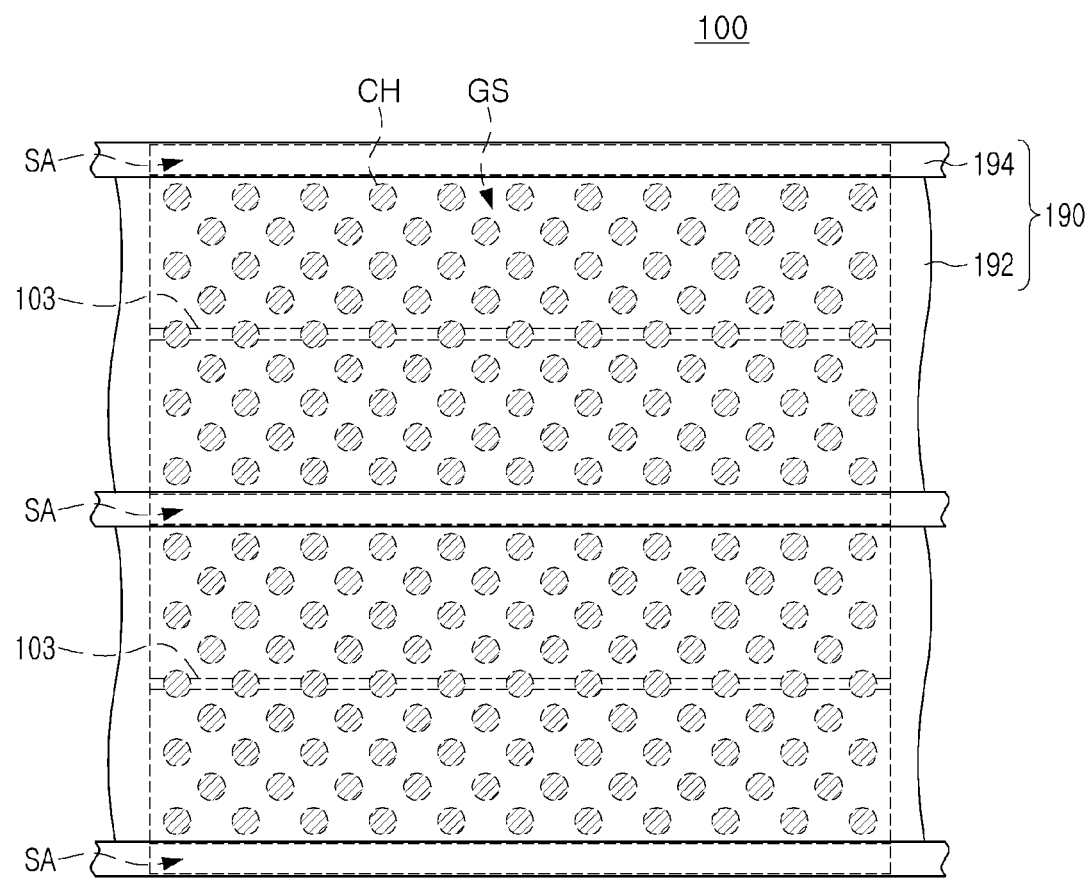
FIG. 3 is a schematic plan view illustrating a semiconductor device according to example embodiments of the inventive concept.
Figure 4:
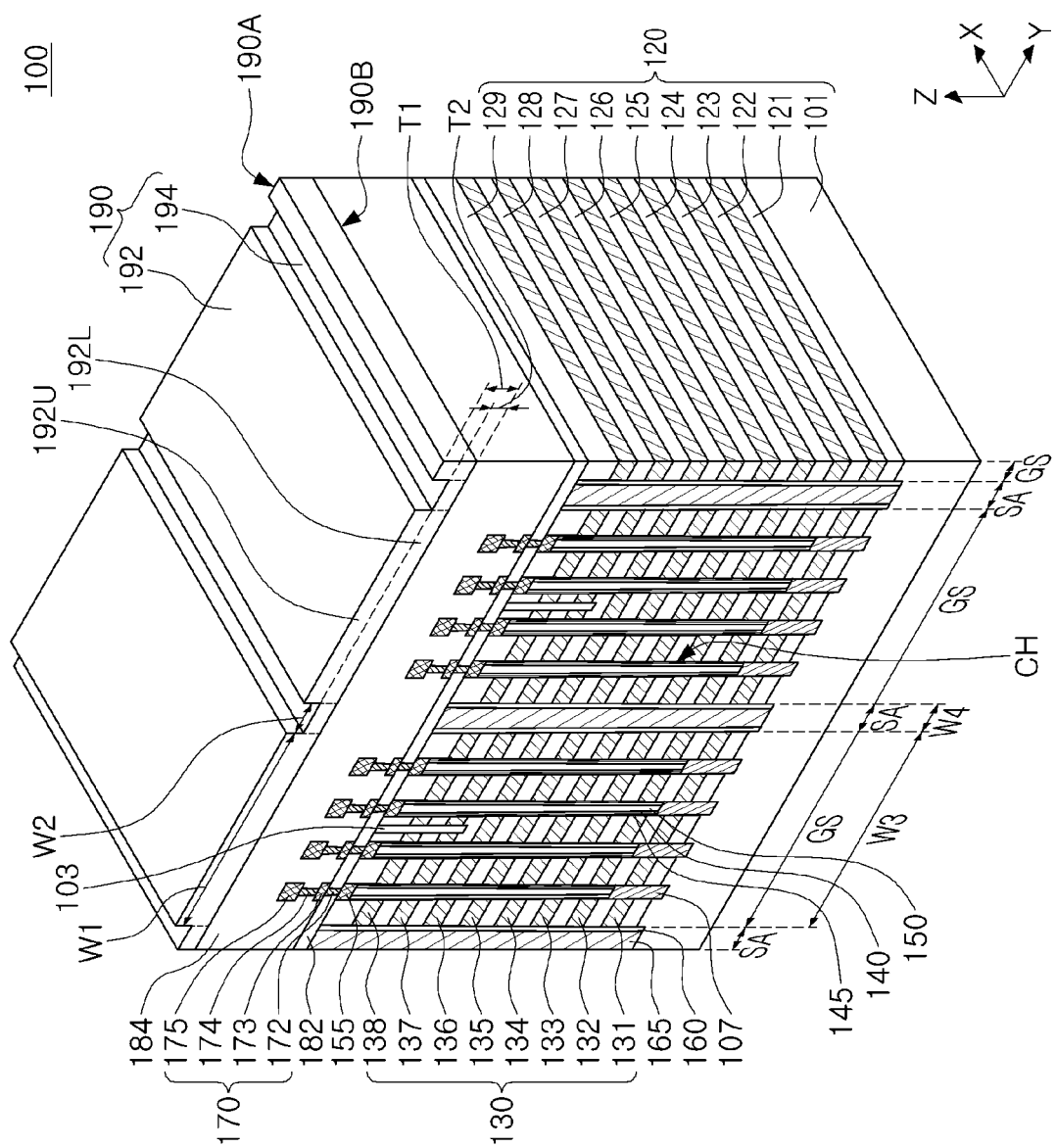
FIG. 4 is a schematic perspective view illustrating a semiconductor device according to example embodiments of the inventive concept.

FIGS. 3 and 4 are a schematic plan view and a schematic perspective view illustrating a semiconductor device according to example embodiments of the present inventive concept. In FIG. 3, only main configurations of a semiconductor device 100 are illustrated, for ease of understanding the present inventive concept.

Referring to FIGS. 3 and 4, the semiconductor device 100 may include a substrate 101, a stacked memory cell array including gate electrodes 130 stacked on the substrate 101, and vertical channels CH passing through the gate electrodes 130, separation areas SA extending through the gate electrodes 130, interconnection layers 170 electrically connected to the channels CH and the gate electrodes 130, and a passivation layer 190 arranged above the interconnection layers 170. The semiconductor device 100 may further include interlayer insulating layers 120 alternately stacked with the gate electrodes 130 on the substrate 101 to form a gate stack structure GS, a conductive layer 165 and separation insulating layer 160 configuring the separation areas SA, channel areas 140 disposed in the channels CH, and first and second upper insulating layers 182 and 184.

In the semiconductor device 100, one memory cell string may be formed around each of the channels CH, and a plurality of memory cell strings may be arranged in rows and columns in an x-direction and a y-direction.

The substrate 101 may have an upper surface extending horizontally in the x-direction and the y-direction. The substrate 101 may include a semiconductor material, such as a Group IV semiconductor material, a Group III-V compound semiconductor material, or a Group II-VI oxide semiconductor material. For example, the Group IV semiconductor material may include silicon, germanium, or silicon-germanium. The substrate 101 may be provided in a form of a bulk wafer or an epitaxial layer.

The plurality of gate electrodes 131 to 138: 130 may be arranged to be spaced apart from each other on a side surface of each of the channels CH in a direction perpendicular to the substrate 101. The gate electrodes 130 may respectively comprise gate electrodes of the ground select transistor GST, the plurality of memory cells MC, and the string select transistors SST1 and SST2, illustrated in FIG. 2. The gate electrodes 130 may extend to comprise the word lines WL0 to WLn, the string select lines SSL1 and SSL2, and the ground select line GSL, wherein the word lines WL0 to WLn may be commonly connected in a predetermined unit of adjacent memory cell strings S arranged in the x-direction and the y-direction. The gate electrodes 130 configuring the string select lines SSL1 and SSL2 may be isolated from each other in the y-direction by a string insulating layer 103. However, the number of gate electrodes 130 isolated by the string insulating layer 103 is not limited to that illustrated in the drawings.

In some example embodiments, the string select transistors SST1 and SST2 and the ground select transistor GST may include one or more the gate electrodes 130, and have the same structure as or a different structure from the gate electrodes 130 of the memory cells MC. Some of the gate electrodes 130, such as the gate electrodes 130 arranged to be adjacent to the gate electrodes 130 of the ground select transistor GST or the string select transistors SST1 and SST2, may be dummy gate electrodes.

As illustrated in FIG. 3, the gate electrodes 130 may be arranged to be spaced apart from each other in the y-direction by the separation areas SA extending in the x-direction. The separation areas SA may have a line shape, and therefore may be referred to as separation lines, where a plurality of separation lines form a separation pattern. For example, the gate electrodes 130 disposed between two or three separation areas SA may form one memory block, but the scale of the memory block is not limited thereto. In some example embodiments, some of the separation areas SA may be isolated in the x-direction in a region not illustrated in the drawings and, accordingly, the plurality of separation areas SA may be spaced apart from each other in the x-direction and aligned in a straight line.

The gate electrodes 130 may include a metal, such as tungsten (W). In some example embodiments, the gate electrodes 130 may include polysilicon or a metal silicide material. In some example embodiments, the gate electrodes 130 may further include a diffusion barrier layer. For example, the diffusion barrier layer may include tungsten nitride (WN), tantalum nitride (TaN), titanium nitride (TiN), or a combination thereof.

The interlayer insulating layers 120 may be interposed between the gate electrodes 130. The interlayer insulating layers 120, like the gate electrodes 130, may be arranged to be spaced apart in a direction perpendicular to an upper surface of the substrate 101 and may extend in the x-direction. The interlayer insulating layers 120 may include an insulating material, such as silicon oxide or silicon nitride. Side surfaces of the interlayer insulating layers 120 may be coplanar with side surfaces of the gate electrodes 130, but are not limited thereto. In some example embodiments, the side surfaces of the interlayer insulating layers 120 may have a structure protruding from the side surfaces of the gate electrodes 130 toward the separation insulating layer 160.

The channels CH may pass through the gate stack structure GS and may be arranged to be spaced apart from each other in rows and columns on the substrate 101. The channels CH may be arranged to form a lattice pattern or a zigzag form in a certain direction. Each of the channels CH may have a side surface perpendicular to the substrate 101. Alternatively, each of the channels CH may have an inclined side surface such that a width thereof decreases toward the substrate 101 depending on an aspect ratio thereof. The channel areas 140 may be disposed in the channels CH. The channel areas 140 may have an annular shape, surrounding channel insulating layers 150 disposed in the channels CH. In some example embodiments, the channel areas 140 may have a pillar shape, such as a cylindrical shape or a prismatic shape, without channel insulating layers 150. The channel areas 140 may be connected to epitaxial layers 107 therebelow. The channel areas 140 may include a semiconductor material, such as polysilicon or single crystalline silicon, and the semiconductor material may be an undoped material or a material including p-type or n-type impurities. The channels CH, adjacently arranged in a straight line in the y-direction, may be respectively connected to different bit lines 173 by channel plugs 172 connected to channel pads 155. In addition, some of the channels CH may be dummy channels, not electrically connected to the bit lines 173.

The channel pads 155 may be disposed on the channel areas 140 of the channels CH. The channel pads 155 may be disposed to cover upper surfaces of the channel insulating layers 150 and electrically connected to the channel areas 140. The channel pads 155 may include, for example, doped polysilicon.

A gate dielectric layer 145 may be interposed between the gate electrodes 130 and the channel areas 140. The gate dielectric layer 145 may include a tunneling layer, a charge storage layer, and a blocking layer, sequentially stacked on the channel areas 140. The tunneling layer may allow charges to move to the charge storage layer in an F-N tunneling mechanism. The tunneling layer may include, for example, silicon oxide ($SiO_2$), silicon nitride ($Si_3N_4$), silicon oxynitride (SiON), or a combination thereof. The charge storage layer may be a charge-trapping layer or a floating gate conductive layer. In some example embodiments, when the charge storage layer is the charge-trapping layer, the charge storage layer may be formed of silicon nitride. The blocking layer may include silicon oxide ($SiO_2$), silicon nitride ($Si_3N_4$), silicon oxynitride (SiON), a high-k dielectric material, or a combination thereof. In some example embodiments, at least a portion of the blocking layer may extend in parallel to the gate electrodes 130, but are not limited thereto.

The epitaxial layer 107 may be disposed at lower ends of the channels CH on the substrate 101. The epitaxial layer 107 may be disposed on a side surface of at least one gate electrode 130. The epitaxial layer 107 may be disposed in a recessed area of the substrate 101. An upper surface of the epitaxial layer 107 may be higher than an upper surface of the lowest gate electrode 131 and lower than a lower surface of the gate electrode 132 disposed on the lowest gate electrode 131, but is not limited to that illustrated in the drawings. By virtue of the epitaxial layer 107, even when an aspect ratio of the channels CH increases, the channel areas 140 may be stably electrically connected to the substrate 101, and characteristics of the ground select transistor GST disposed between the memory cell strings may be uniform. However, in some example embodiments, the epitaxial layer 107 may be omitted. In this case, the channel areas 140 may be directly connected to the substrate 101.

The separation areas SA may pass through the gate stack structure GS between the channels CH to be connected to the substrate 101. The separation areas SA may be electrically insulated from the gate electrodes 130 by the separation insulating layer 160. Accordingly, the gate electrodes 130 may be physically and electrically separated from each other at predetermined intervals in the y-direction, with the conductive layer 165 therebetween to form a plurality of vertical gate stack structures, also referred to as vertical memory cell structures. The conductive layer 165 may have a line shape extending in the x-direction and may correspond to the common source line CSL described above with reference to FIGS. 1 and 2. The conductive layer 165 may be arranged at predetermined intervals in the y-direction, for example, for every four to five columns of the channels CH, but the present inventive concept is not limited thereto. Although the conductive layer 165 is illustrated as having a side surface perpendicular to the upper surface of the substrate 101 in the drawings, the source conductive layer 180 may have a shape in which a width thereof decreases toward the substrate 101 due to a high aspect ratio.

The interconnection layers 170 may be electrically connected to the gate electrodes 130, the channel areas 140, and the conductive layer 165, and may be arranged to electrically connect the memory cells MC to circuit devices not illustrated in the drawings. The interconnection layers 170 may be disposed in the first and second upper insulating layers 182 and 184. The first and second upper insulating layers 182 and 184 may be formed of an insulating material. For example, the first and second upper insulating layers 182 and 184 may include silicon oxide or silicon nitride. Each of the first and second upper insulating layers 182 and 184 may be formed of a plurality of layers. The interconnection layers 170 may include channel plugs 172, bit lines 173, first plugs 174, and first interconnection lines 175, sequentially stacked on the channel pad 155. The number of the plugs and interconnection lines configuring the interconnection layers 170 may be variously modified according to various example embodiments. The interconnection layers 170 may include a conductive material, such as tungsten (W), copper (Cu), or aluminum (Al).

The passivation layer 190 may be disposed on the interconnection layers 170 and may function to protect underlying devices from moisture and impurities. A polyimide layer may further be disposed on the passivation layer 190 for performing a subsequent packaging process.

The passivation layer 190 may include first regions and second regions that comprise first line patterns 192 and second line patterns 194. The first and second line patterns 192 and 194 may have a line shape extending in the x-direction. The first and second line patterns 192 and 194 may have different vertical thicknesses from each other. The first and second line patterns 192 and 194 may have different widths from each other in the y-direction. Lower surfaces of the first and second line patterns 192 and 194 may be arranged to be continuously connected with no level difference. For example, a lower surface 190B of the passivation layer 190 may form a continuous flat or curved surface, unlike an upper surface 190A of the passivation layer 190. Accordingly, the passivation layer 190 may have unevenness on the upper surface 190A thereof (e.g., a step shape). The lower surface 190B of the passivation layer 190 may have a flat surface or a surface curved according to a profile of the underlying interconnection layers 170. It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The first line patterns 192 may have a first thickness T1, and the second line patterns 194 may have a second thickness T2 smaller than the first thickness T1. The first line patterns 192 may have a first width W1, and the second line patterns 194 may have a second width W2 smaller than first width W1. For example, the first thickness T1 may be in a range between 5000 Å and 10000 Å, and the second thickness T2 may be in a range between 3000 Å and 8000 Å. The difference (ΔT) between the first thickness T1 and the second thickness T2 may be in a range between 2000 Å and 7000 Å, and in one embodiment is about 2000 Å. In one embodiment, a ratio of the thickness of the entire passivation layer 192 (e.g., T2) to the thickness bottom portion of the passivation layer 192L (e.g., T1) may be between about 5:3 and about 5:4. For example, the first width W1 may be in a range between 1 μm to 3 μm, and the second width W2 may be in a range between 10 nm to 300 nm. Compared to a thickness (e.g., height) of the semiconductor device 100, the first thickness T1 may be between about 4% and 16%, and in some optimal cases, about 10% of the thickness of the semiconductor device 100 (e.g., from a bottom of the substrate 101 to a top-most surface of the passivation layer 190). Alternatively, or in addition, the first thickness T1 may be between about 4% and 16%, and in some optimal cases, about 10% of the thickness (e.g., height) from a top of the substrate 101 to a top-most surface of the passivation layer 190. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first line patterns 192 may be arranged above the gate electrodes 130 or the gate stack structure GS to be vertically aligned with the gate electrodes 130 and gate stack structures GS, and the second line patterns 194 may be arranged above the separation areas SA to be vertically aligned with the separation areas SA. However, the arrangement of the first and second line patterns 192 and 194 is not limited thereto. A width of one gate stack structure GS, that is, a third width W3 of the gate electrodes 130 of one gate stack structure GS may be greater than a fourth width W4 of the separation area SA. In some example embodiments, the first width W1 may be substantially the same as the third width W3, and the second width W2 may be substantially the same as the fourth width W4. In addition, a ratio (W3/W4) of the third width W3 to the fourth width W4 may be substantially the same as a ratio (W1/W2) of the first width W1 to the second width W2, but the present inventive concept is not limited thereto. For example, the ratio (W3/W4) of the third width W3 to the fourth width W4 may be in a range between 80% and 120% of the ratio (W1/W2) of the first width W1 to the second width W2. The ratio (W1/W2) of the first width W1 to the second width W2 may be, for example, greater than about 5 and smaller than about 50. When the ratio (W1/W2) is smaller than 5, a stress releasing effect may not be sufficient in the x-direction. When the ratio (W1/W2) is greater than 50, stress may increase in the y-direction. However, the ratio (W1/W2) may be adjusted in consideration of the thicknesses T1 and T2 of the first and second line patterns 192 and 194, a total volume of the gate electrodes 130, and a degree of warpage in the semiconductor device 100 to be described later.

Because a gap may be formed in the passivation layer 190 where the second line patterns 194 are formed, those patterns may be referred to as gap regions. As shown in FIG. 4 and discussed above, at the gap regions, a vertical thickness of the passivation layer may be less than a vertical thickness of the passivation layer at regions where the first line patterns 192 are formed. However, in some embodiments (not shown in FIG. 4), instead of part of the thickness of the passivation layer being removed at the second line patterns 194, the passivation layer may be absent, such that there is no passivation layer at the gap regions (e.g., all of the thickness of the passivation layer may be removed). Thus, in one embodiment, the passivation layer 190 is continuously formed in the Y direction to cover a plurality of gate stack structures separated by gap regions, such as separation lines, and has recess regions that form those separation lines where a thickness is smaller than full-thickness (e.g., non-recessed) regions. In another embodiment, the passivation layer 190 is not continuously formed in the Y direction (at least from a cross-sectional view) because there are gap regions where the passivation layer 190 is absent.

The passivation layer 190 may be formed of a material applying stress to the substrate 101 in a different direction from the gate electrodes 130. The passivation layer 190 may be formed of silicon nitride, for example. In some example embodiments, the first and second line patterns 192 and 194 configuring the passivation layer 190 may be formed of different materials from each other. Alternatively, a lower layer 192L of the first line patterns 192 having the same upper surface as the second line patterns 194 may be formed of the same material as the second line patterns 194, and an upper layer 192U of the first line patterns 192 may be formed of a different material from the second line patterns 194.

Material layers formed on the substrate 101 may apply stress to the substrate 101 disposed therebelow and other material layers disposed thereabove. Due to this, warpage may occur in the semiconductor device 100 including the substrate 101. In particular, stress applied by a material layer disposed on the entire upper surface of the substrate 101 or arranged at a large ratio to the entire upper surface of the substrate 101, may be a main cause of the warpage. For example, the gate electrodes 130 may apply tensile stress to the substrate 101. In this case, the semiconductor device 100 including the substrate 101 may be concavely warped. That is, an edge portion of the substrate 101 may be lifted up, and a center portion of the substrate 101 may protrude downwardly. In contrast, the passivation layer 190 may apply compressive stress to the substrate 101. In this case, the semiconductor device 100, including the substrate 101, may be convexly warped.

In particular, the passivation layer 190 may be arranged such that the first and second line patterns 192 and 194 have different thicknesses and widths from each other in consideration of the gate electrodes 130 extending in the x-direction and arranged to be spaced apart from each other in the y-direction by the separation areas SA. Accordingly, the warpage of the semiconductor device 100 in certain directions may be effectively reduced. Accordingly, the passivation layer 190 according to the example embodiment of the present inventive concept may function as a stress releasing layer as well as a protection layer. This will be described in more detail with reference to FIGS. 5A to 5C.

Figure 5A:
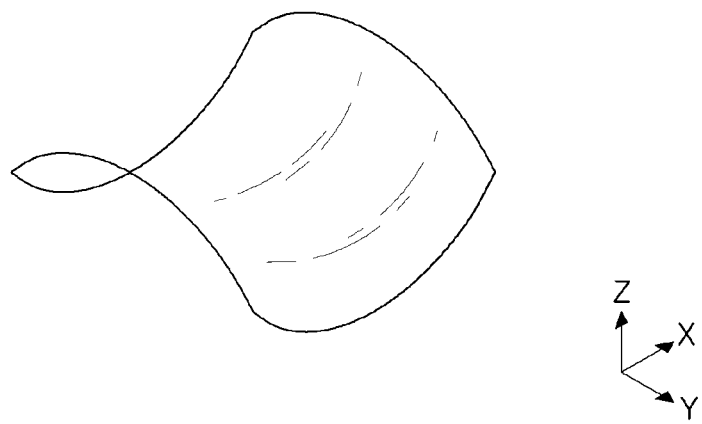
FIGS. 5A to 5C are diagrams provided to illustrate warpage of a semiconductor device according to example embodiments of the inventive concept.
Figure 5B:
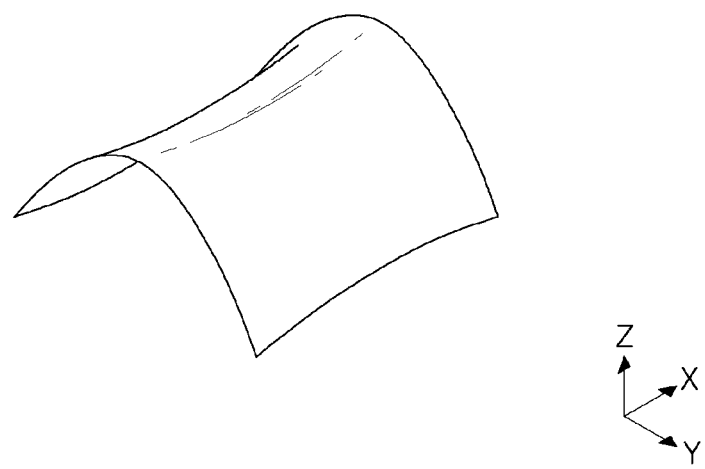
Figure 5C:
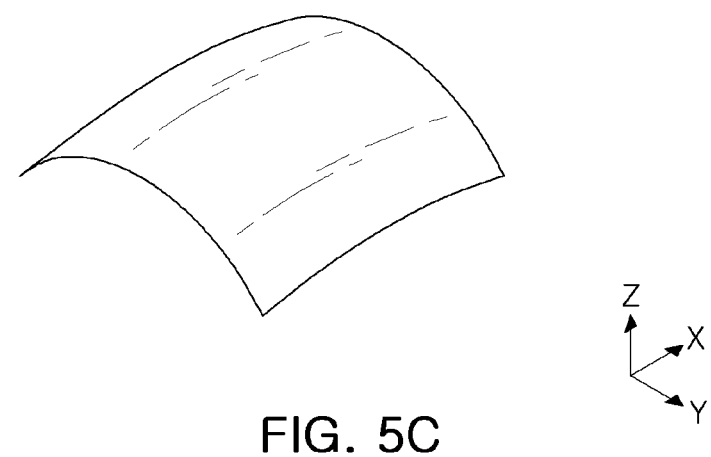

FIGS. 5A to 5C are diagrams provided to illustrate warpage of a semiconductor device according to example embodiments of the present inventive concept.

Referring to FIG. 5A, a degree of warpage of a semiconductor device in one chip unit without accounting for the passivation layer 190 (refer to FIGS. 3 and 4) is exemplarily illustrated. Thus, FIG. 5A may represent the amount of warpage that would occur if certain heating processes (e.g., solder reflow) were to take place without the passivation layer 190 in place. The semiconductor device may be subjected to anisotropic stress applied in the x-direction and the y-direction, and thereby a saddle-shaped warpage may occur. That is, the semiconductor device may have a shape protruding downwardly (concave) in the x-direction and protruding upwardly (convex) in the y-direction. Such anisotropic stress may be generated, for example, since the gate stack structure GS is arranged in a line shape extending in the x-direction. However, materials configuring other structures and process conditions may affect the warpage of the semiconductor device.

Referring to FIG. 5B, a degree of warpage of a semiconductor device according to a comparative example in which the passivation layer 190 is formed to have a uniform thickness is exemplarily illustrated. The passivation layer 190 may have a tendency to apply compressive stress to a semiconductor device and thereby convexly warp the semiconductor device, as described above. Accordingly, compared with the semiconductor device illustrated in FIG. 5A, bending of the semiconductor device may become more gentle in the x-direction but become more severe in the y-direction in which the semiconductor device already tends to have a convexly warped shape (e.g., due to heating processes such as a solder reflow process). Thus, when a semiconductor device is warped due to anisotropic stress, the stress may further increase in a certain direction even though a stress-releasing layer configured to apply one of the compressive stress and the tensile stress is deposited.

Referring to FIG. 5C, a degree of warpage of a semiconductor device in which the passivation layer 190 includes the first and second line patterns 192 and 194 having different thicknesses from each other as described above with reference to FIGS. 3 and 4, is exemplarily illustrated. Compared with FIG. 5B, the stress may further be released or reduced in the x-direction and the bending may become gentle or reversed, for example compared to a situation where no passivation layer is used. In the y-direction, the bending may be similar to that illustrated in FIG. 5A, and may be prevented from at least becoming severe like that illustrated in FIG. 5B. Thus, in the y-direction, an increase in warpage shown in FIG. 5B may be limited by using the passivation layer 190 described herein (e.g., compared to a situation where a passivation layer having a uniform thickness throughout is used). In this manner, warpage in the y-direction is reduced. Stated another way, the use of a passivation layer 190 such as described herein may increase warpage in the y-direction compared to a situation where no passivation layer is used, but limits the increase, and reduces warpage compared to when a flat, uniform thickness passivation layer is used.

Referring to FIGS. 3 and 4 together, when the passivation layer 190 includes the first and second line patterns 192 and 194 having different thicknesses from each other, the stress may be released in the y-direction due to a space between the first line patterns 192, for example, a region in which the passivation layer 190 is not arranged on the second line patterns 194. The stress may increase in the x-direction since the first line patterns 192 has a larger volume than the second line patterns 194 due to thickness increment (ΔT). Accordingly, the existing stress releasing effect may be maximized in the x-direction, while the increase of the stress due to the thickness increment (ΔT) is minimized in the y-direction.

As discussed above, when first and second line patterns 192 and 194 are formed to have different vertical thicknesses from each other, as shown for example in FIG. 4, the first line patterns 192 are arranged to reduce warpage of the semiconductor device in the x-direction compared to a warpage that would exist without the passivation layer 190 (e.g., by applying a stress that counteracts the concave warpage in the x-direction caused by the differences in thermal expansion coefficients of the substrate 101 and the gate stack including layers 120 and 130), and the first line patterns 192 combined with the second line patterns 194 are arranged to increase warpage of the semiconductor device in the y-direction compared to a warpage that would exist without the passivation layer 190 (e.g., by applying a stress that adds to the convex warpage in the y-direction caused by differences in thermal expansion coefficients of the substrate 101 and the different layers formed on the substrate 101 in the y-direction). However, because of the second line patterns 194, the first line patterns 192 combined with the second line patterns 194 decrease warpage in the x-direction by a greater amount than the first line patterns 192 combined with the second line patterns 194 increase warpage in the y-direction, thereby having an overall beneficial effect on warpage of the semiconductor device 100. For example, the passivation layer 190 with first line patterns 192 and second line patterns 194 may reduce the x-direction warpage effect caused by layers below the passivation by 70% to 100% while increasing the y-direction warpage effect by 5% to 30% (e.g., wherein warpages can be measured according to arc height at a maximum distance from a line connecting ends of the arc). In some embodiments, there may be no increase in y-direction warpage due to passivation layer 190. As a result, the passivation layer 190 is patterned to reduce the amount of warpage of the semiconductor device in a first direction, such as the x-direction, without reducing the warpage of the semiconductor device in a second direction, such as the y-direction. It should be noted that based on the above patterning, the second regions of the passivation layer (e.g., second line patterns 194) counteract warpage to the semiconductor device 100 caused by the conductive material (e.g., that forms the conductive layers 165) of the separation areas SA.

Figure 6:
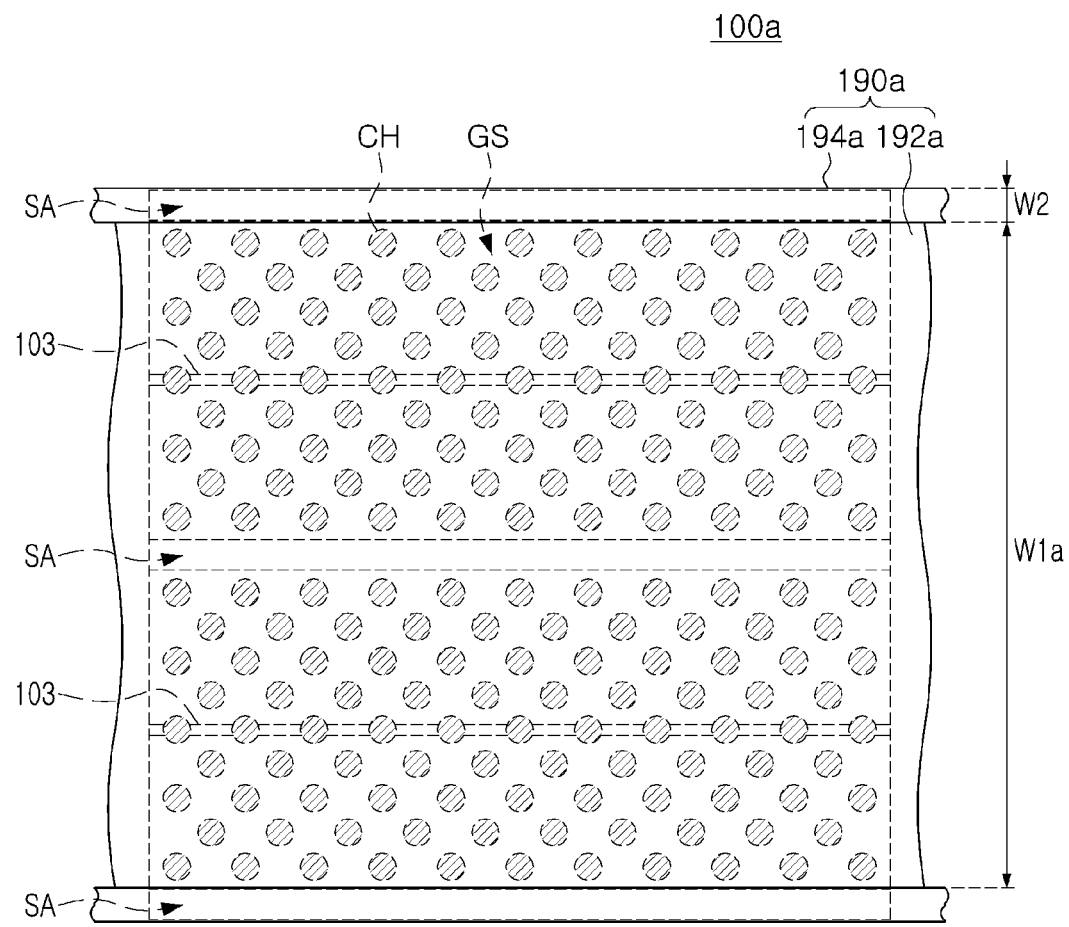
FIGS. 6 and 7 are schematic plan views illustrating a semiconductor device according to example embodiments of the inventive concept.
Figure 7:
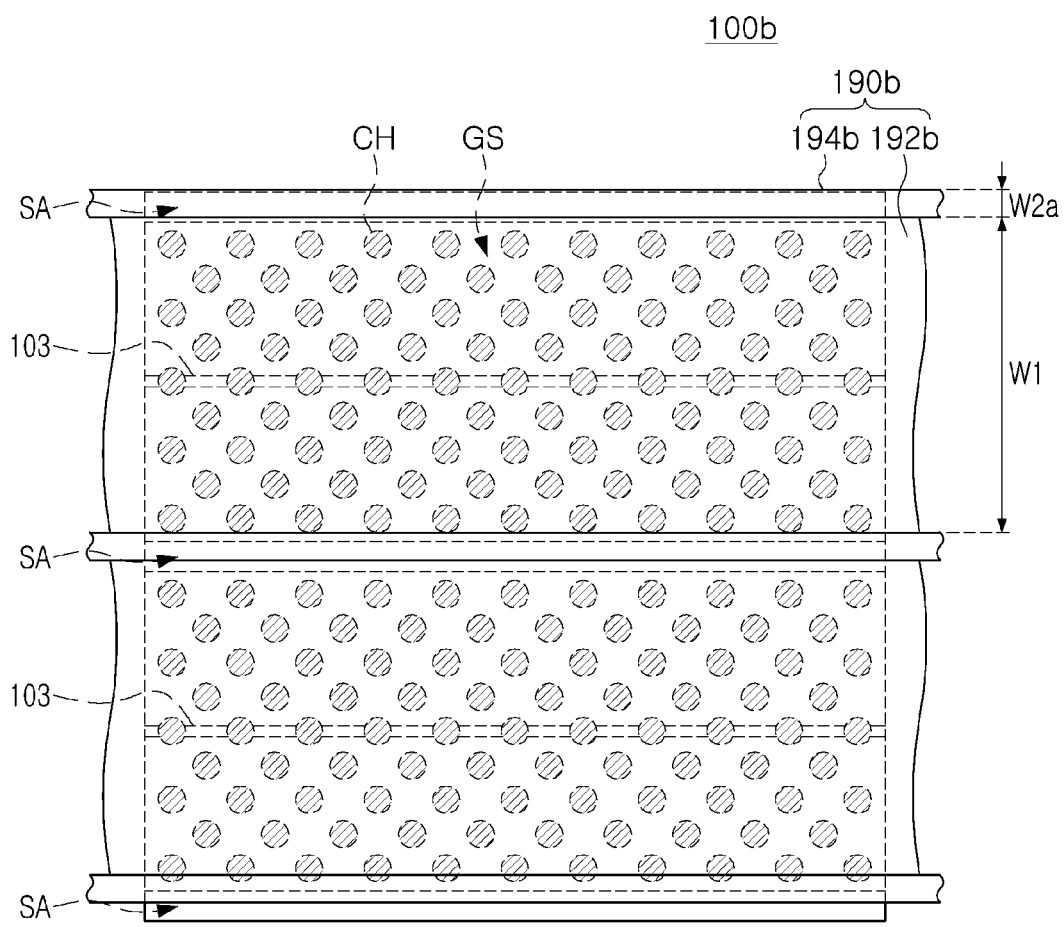

FIGS. 6 and 7 are schematic plan views illustrating a semiconductor device according to example embodiments.

Referring to FIG. 6, a passivation layer 190a of a semiconductor device 100a may include first line patterns 192a having a relatively large width Wla covering two gate stack structures GS spaced apart from each other in the y-direction and second line patterns 194a having a width W2 the same as or similar to a width of a separation area SA, unlike the semiconductor device 100 according to the example embodiment described with reference to FIG. 3. The first line patterns 192a may be arranged on two gate stack structures GS and one separation area SA, and the second line patterns 194 may be arranged on the separation areas SA on both sides of the first line patterns 192a. As shown in this embodiment, the widths of the first and second line patterns 192a and 194a configuring the passivation layer 190a may be variously modified according to various example embodiments of the present inventive concept.

Referring to FIG. 7, a passivation layer 190b of a semiconductor device 100b may include first line patterns 192b having a width W1 covering one gate stack structure GS and second line patterns 194b having a width W2a smaller than that of the separation area SA, unlike the semiconductor device 100 according to the example embodiment described with reference to FIG. 3. Accordingly, at least a portion of the first and second line patterns 192b and 194b may be arranged to be shifted from a top of the gate stack structure GS and the separation area SA. According to this embodiment, the first and second line patterns 192b and 194b configuring the passivation layer 190b may not be exactly aligned with the gate stack structure GS and the separation area SA.

Figure 13:
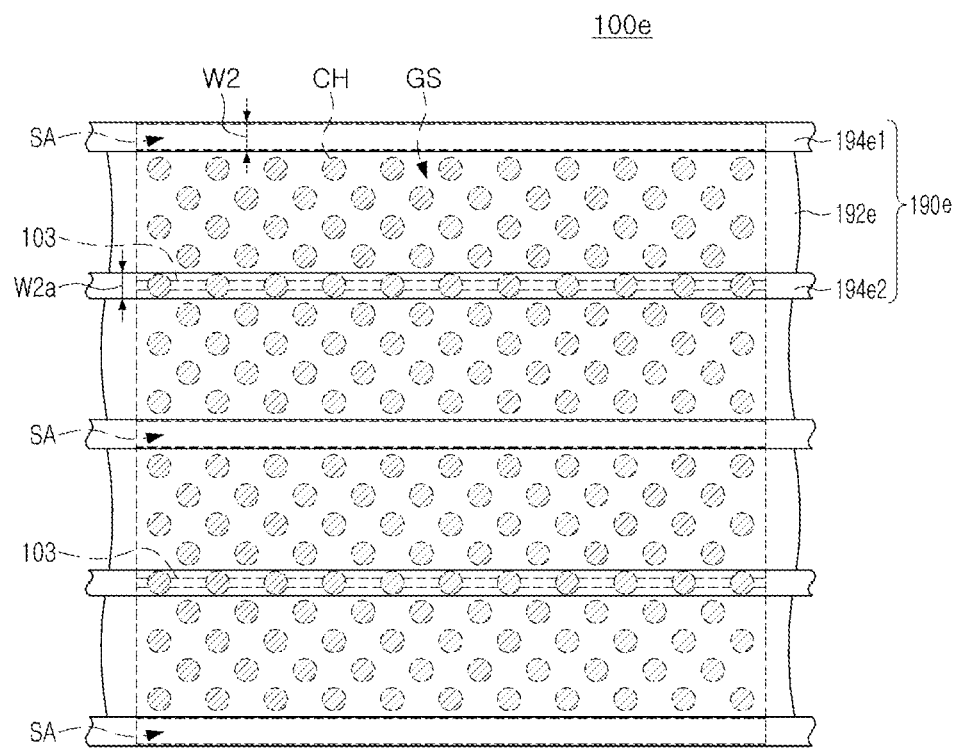
FIGS. 13-17 are schematic plan views illustrating a semiconductor device according to example embodiments of the inventive concept.

FIG. 13 is a schematic plan view illustrating a semiconductor device according to example embodiments. Referring to FIG. 13, a passivation layer 190e of a semiconductor device 100e may include first line patterns 192e having a relatively wide width covering portions of gate stack structures GS and second line patterns 194e1 and 194e2, unlike the semiconductor device 100 according to the example embodiment described with reference to FIG. 3. The first line patterns 192e may be arranged between the second line patterns 194e1 and 194e2, and some of the second line patterns 194e1 may be arranged on a separation areas SA and some of the second line patterns 194e2 may be arranged on a string insulating layer 103. The second line patterns 194e2 on the string insulating layer 103 may have a width W2a the same as or narrower than the second width W2 of the second line patterns 194e1. The width W2a of the second line patterns 194e2 may be the same as or larger than a width of the string insulating layer 103.

Figure 14:
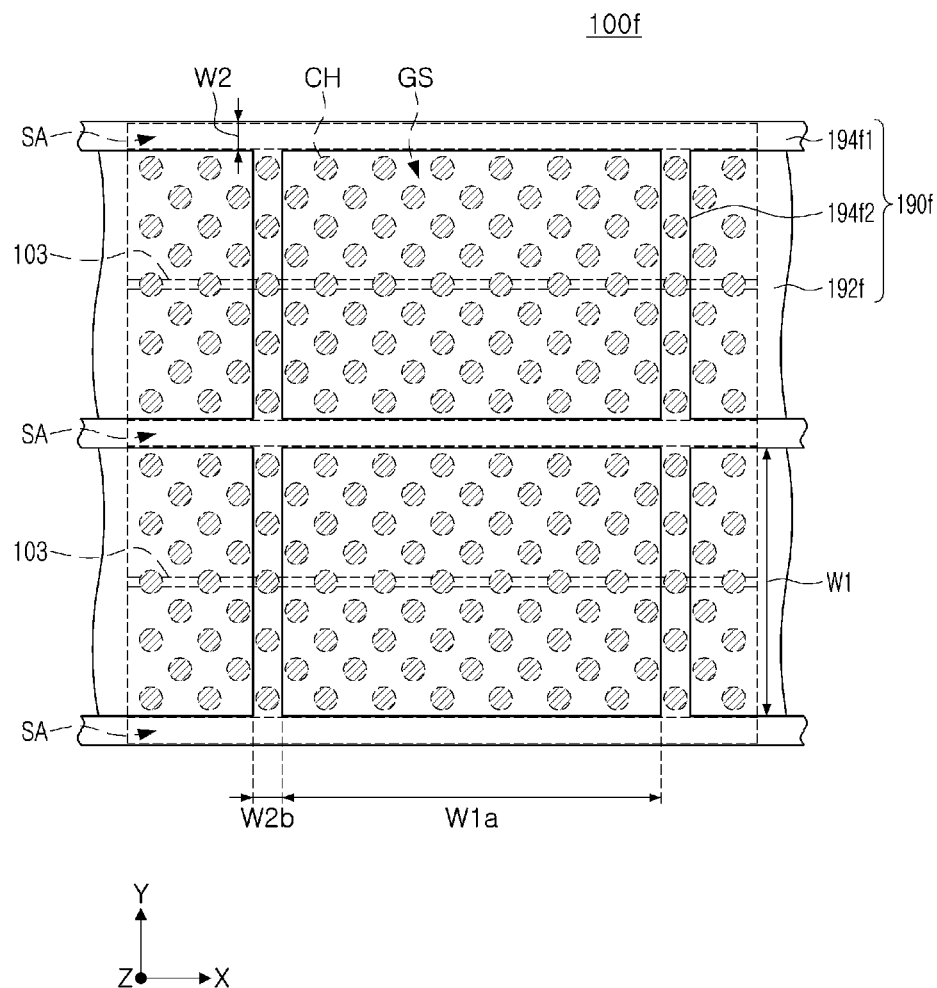

FIG. 14 is a schematic plan view illustrating a semiconductor device according to example embodiments. Referring to FIG. 14, a passivation layer 190f of a semiconductor device 100f may include first line patterns 192f having a rectangular shape and second line patterns 194f1 and 194f2, unlike the semiconductor device 100 according to the example embodiment described with reference to FIG. 3. The first line patterns 192f may be arranged in a region bounded by the second line patterns 194f1 and 194f2, and some of the second line patterns 194f1 may be arranged on a separation area SA and some of the second line patterns 194f2 may be arranged perpendicular to the second line patterns 194f1 between the second line patterns 194f1. The second line patterns 194f2 may have a width W2b the same as or similar to the second width W2 of the second line patterns 194f1. A width Wla of the first line patterns 192f in the x-direction may be wider than the first width W1 of the first line patterns 192f in the y-direction to ensure a stress releasing effect in the x-direction.

Figure 15:
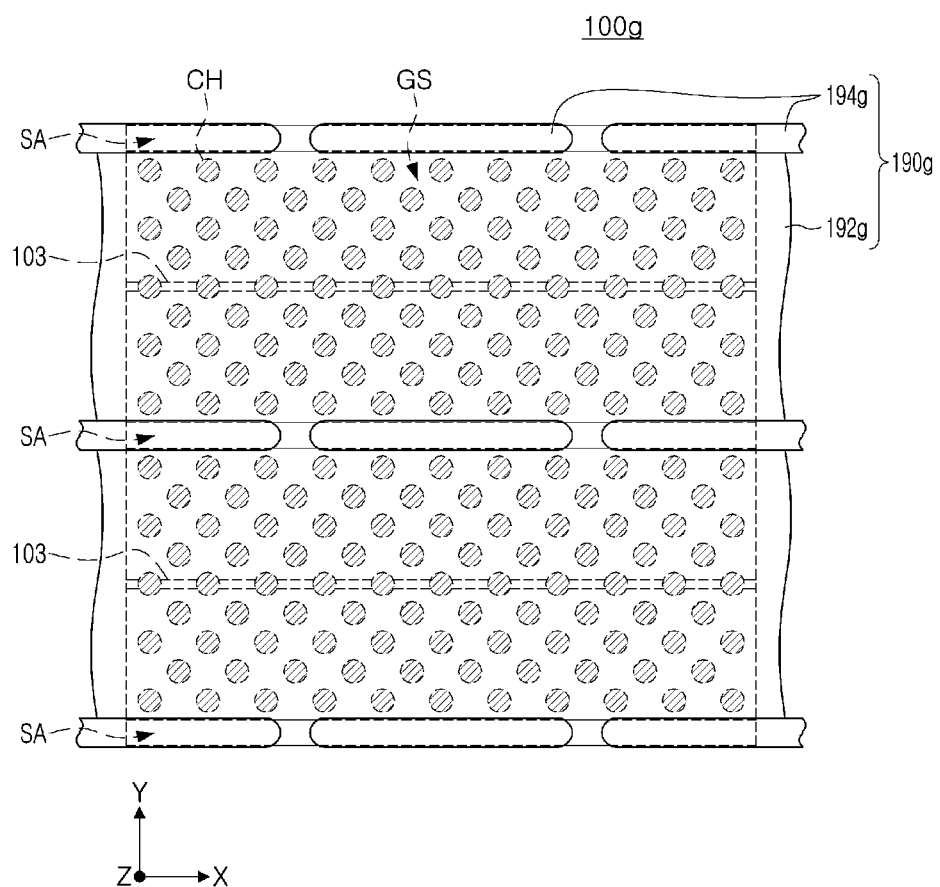

FIG. 15 is a schematic plan view illustrating a semiconductor device according to example embodiments. Referring to FIG. 15, a passivation layer 190g of a semiconductor device 100g may include first line patterns 192g and second line patterns 194g having an elongated line shape, unlike the semiconductor device 100 according to the example embodiment described with reference to FIG. 3. The first line patterns 192g may be arranged surrounding the second line patterns 194g, and the second line patterns 194g may be arranged to be spaced apart from each other in the x-direction. Shapes and sizes of the second line patterns 194g may be variously modified according to example embodiments and, for example, the second line patterns 194g may have circular, oval, or rectangular shapes. For example, a gap region between first line patterns 192g in the y-direction may include a plurality of line patterns extending in the x-direction and arranged end-to-end in the x-direction FIGS. 8 and 9 are schematic cross-sectional views illustrating a semiconductor device according to example embodiments.

Figure 8:
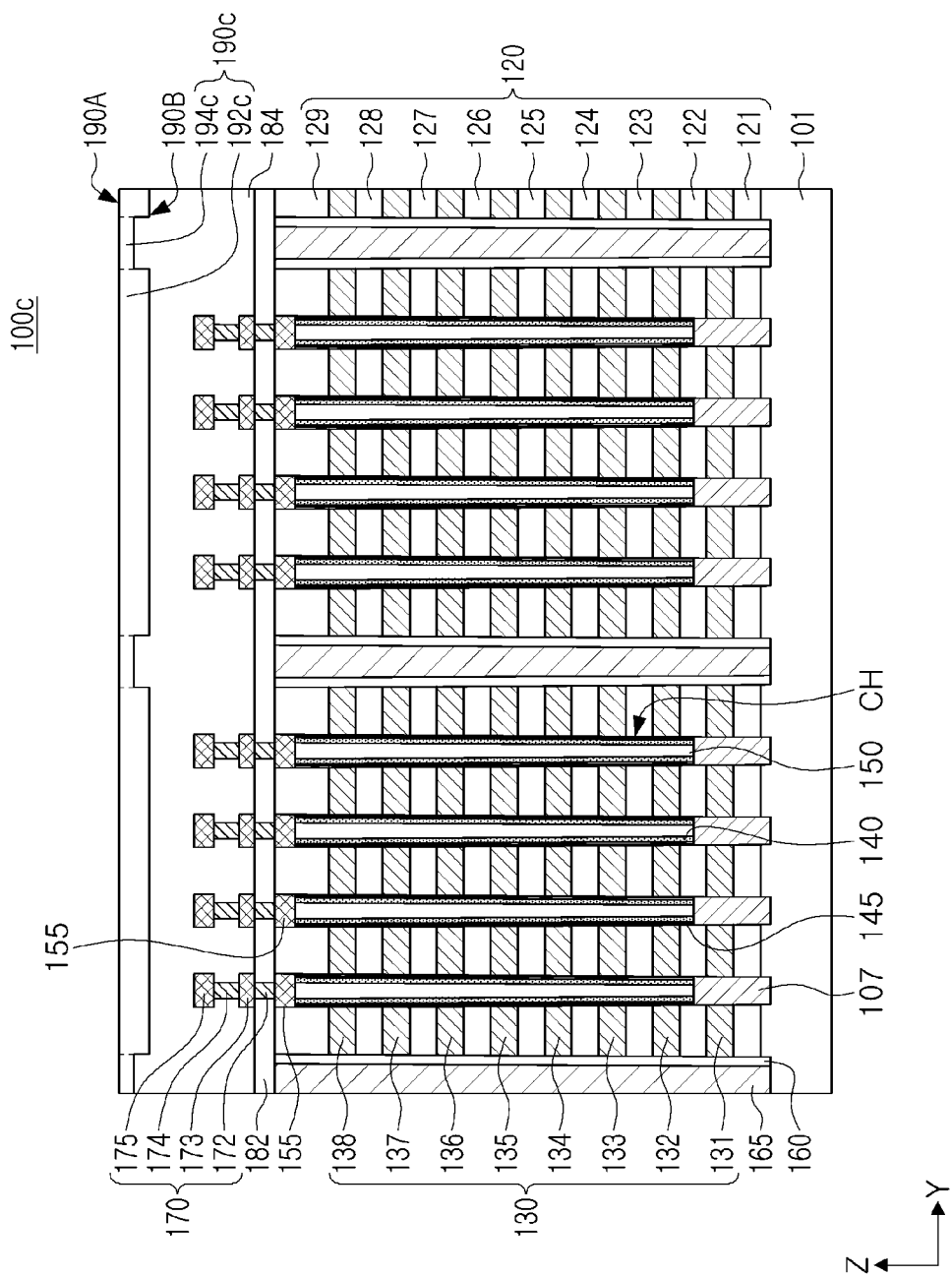
FIGS. 8 and 9 are schematic cross-sectional views illustrating a semiconductor device according to example embodiments of the inventive concept.

Referring to FIG. 8, a passivation layer 190c of a semiconductor device 100c may have an upper surface 190A having a continuous flat or curved surface and a lower surface 190B having an uneven profile. For example, the first and second line patterns 192c and 194c may be arranged in such a manner that upper surfaces thereof are continuously connected. Such relative arrangement of the first and second line patterns 192c and 194c may be modified according to a preferred shape of upper surfaces and/or profiles of underlying interconnection layers 170 and second upper insulating layer 184.

Figure 9:
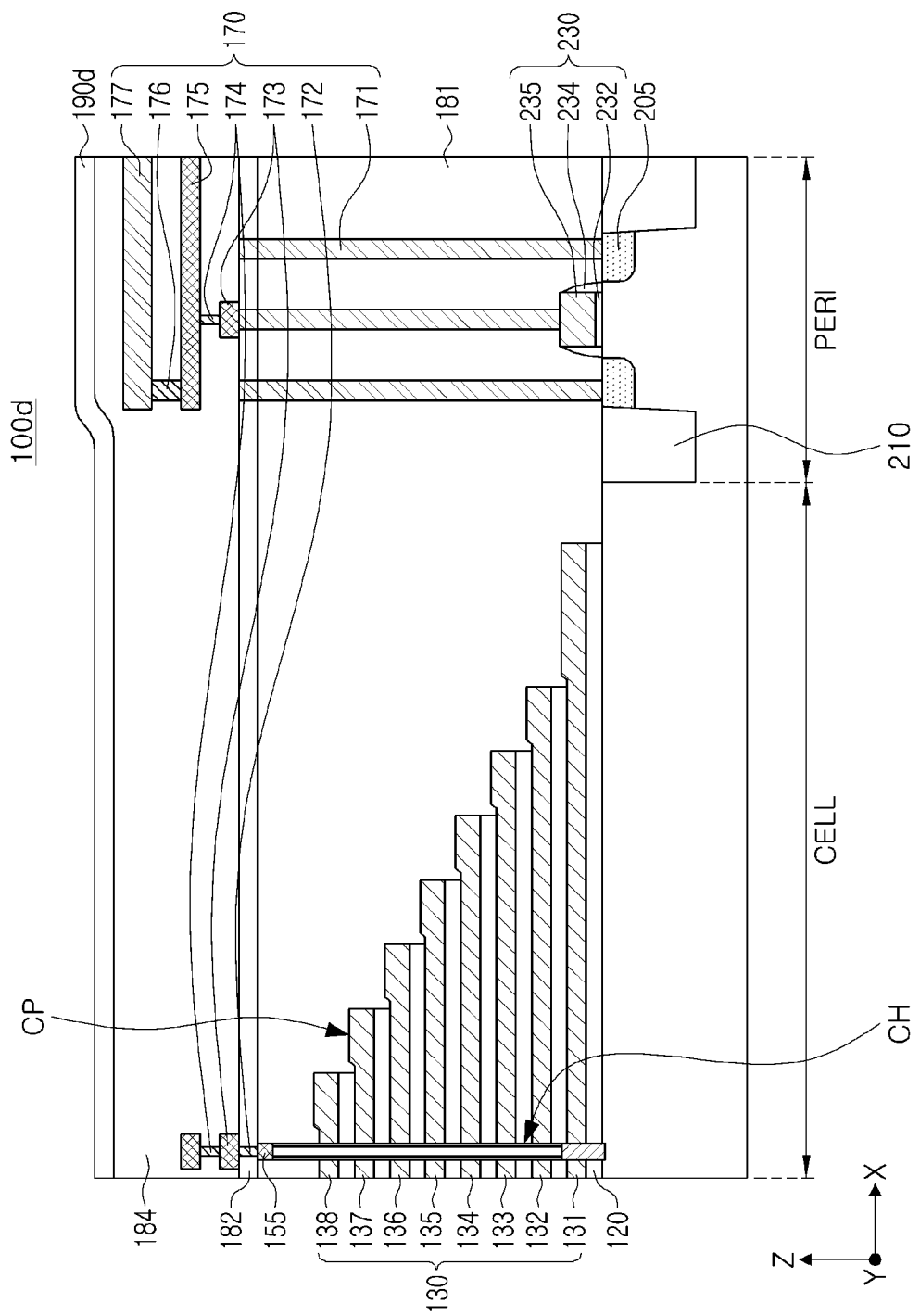

Referring to FIG. 9, a semiconductor device 100d may include a memory cell region CELL and a peripheral circuit region PERI. The memory cell region CELL may correspond to the memory cell array 20 illustrated in FIG. 1, and the peripheral circuit region PERI may correspond to the control logic 30 illustrated in FIG. 1. The peripheral circuit region PERI may be arranged in at least one end of the memory cell region CELL in at least one direction, for example, in the x-direction.

The gate electrodes 130 may extend from an edge area of the memory cell region CELL by different lengths. In the edge area, the gate electrodes 130 may extend in the x-direction by different lengths to provide contact areas CP having a step-wise structure. The gate electrodes 130 may be connected to contact plugs in the contact areas CP, and thereby be connected to upper interconnection layers 170 and/or external connection terminals for connecting the semiconductor device to an external device. In the contact areas CP, the gate electrodes 130 may be thickened so as to be stably connected to the contact plugs.

The circuit devices 230 may be arranged on an active region defined by device isolation layers 210. The circuit devices 230 may include planar transistors. Each of the circuit devices 230 may include a circuit gate insulating layer 232, a spacer layer 234, and a circuit gate electrode 235. Source/drain areas 205 may be arranged in a base substrate 201 on both sides of the circuit gate electrode 235.

The interconnection layers 170 may include circuit contact plugs 171, channel plugs 172, bit lines 173, first plugs 174, a first interconnection line 175, second plugs 176, and a second interconnection layer 177. The circuit contact plugs 171 may pass through a peripheral region insulating layer 181 and a first upper insulating layer 182 to connect the circuit devices 230 to the interconnection layers 170. The number of plugs and interconnection lines configuring the interconnection layers 170 may be variously modified according to various example embodiments.

A passivation layer 190d may include first and second line patterns 192 and 194 alternately disposed in the y-direction, as that according to the example embodiment described above with reference to FIGS. 3 and 4. In an example embodiment, the passivation layer 190d may extend from the memory cell region CELL to the peripheral circuit region PERI. The passivation layer 190d may be arranged not to be limited on the gate electrodes 130 but to extend to the entire semiconductor device 100d including the peripheral circuit region PERI. However, the arrangement of the passivation layer 190d is not limited thereto. In some example embodiments, the passivation layer 190d may be arranged only on the memory cell region CELL.

The passivation layer 190d may have a lower surface curved according to a profile of underlying interconnection layers 170 and second upper insulating layer 184. For example, as illustrated in FIG. 9, the second upper insulating layer 184 may have an upper surface curved according to the second interconnection layer 177. In this case, the passivation layer 190d arranged on the second upper insulating layer 184 may be curved according to the upper surface of the second upper insulating layer 184.

FIGS. 10A to 10I are schematic drawings of main processes of a method of manufacturing a semiconductor device according to example embodiments of the present inventive concept. In FIGS. 10A to 10I, a region corresponding to a cross-sectional area in the y-z plane of FIG. 4 is illustrated.

Figure 10A:
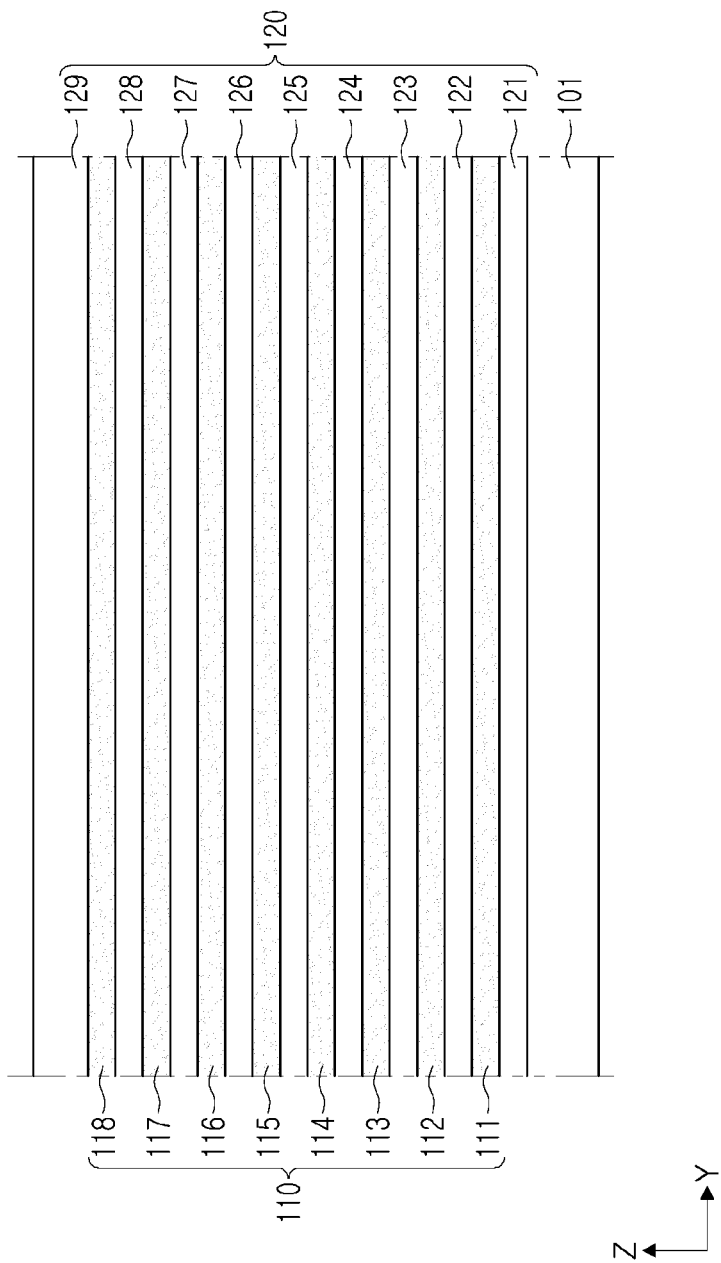
FIGS. 10A to 10I are schematic drawings of main processes of a method of manufacturing a semiconductor device according to example embodiments of the inventive concept.

Referring to FIG. 10A, sacrificial layers 111 to 118: 110 and interlayer insulating layers 121 to 129: 120 may be alternately stacked on a substrate 101.

The sacrificial layers 110 may be substituted by gate electrodes 130 in a subsequent process. The sacrificial layers 110 may be formed of a different material from the interlayer insulating layers 120. For example, the interlayer insulating layers 120 may be formed of at least one of silicon oxide and silicon nitride, and the sacrificial layers 110 may be formed of a different material from the interlayer insulating layers 120, selected from silicon, silicon oxide, silicon carbide, and silicon nitride. In some example embodiments, thicknesses of the interlayer insulating layers 120 may not be the same. For example, the lowest interlayer insulating layer 121 may be relatively thin, and the uppermost interlayer insulating layer 129 may be relatively thick. The thickness and the number of layers configuring the interlayer insulating layers 120 and the sacrificial layers 110 may be variously modified from those illustrated in the drawings.

Figure 10B:
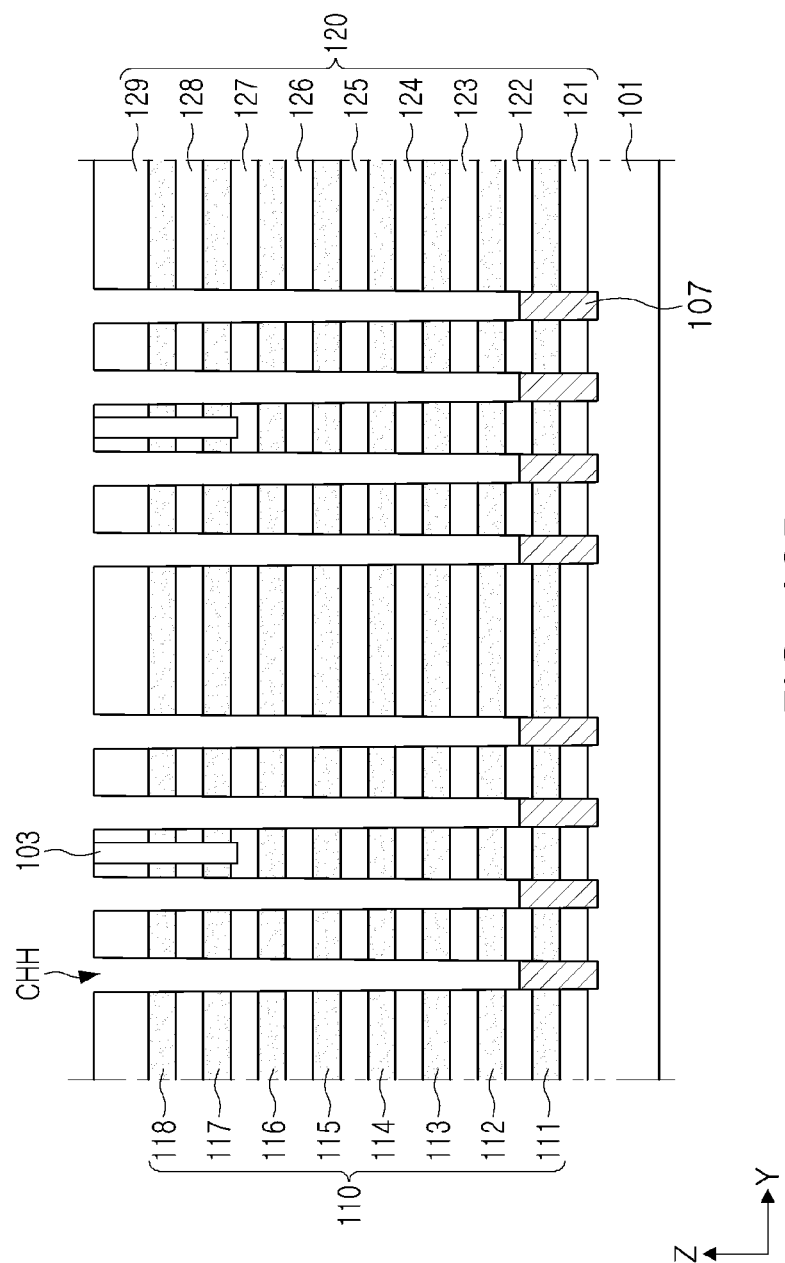

Referring to FIG. 10B, the process may include forming a string insulating layer 103, forming channel holes CHH extending perpendicularly to the substrate 101, and forming an epitaxial layer 107 at lower portions of the channel holes CHH.

The string insulating layer 103 may be formed by removing a predetermined number of sacrificial layers 110 and interlayer insulating layers 120 from the top, using an additional mask layer. The string insulating layer 103 may be formed by depositing an insulating material on a portion from which the sacrificial layers 110 and the interlayer insulating layers 120 are removed. The string insulating layer 103 may be formed of a material having an etch selectivity with respect to the sacrificial layers 110, together with the interlayer insulating layers 120. For example, the string insulating layer 103 may be formed of the same material as the interlayer insulating layer 120.

The channel holes CHH may be formed in a hole shape by anisotropically etching a stacked structure of the sacrificial layers 110 and the interlayer insulating layers 120. Due to a height of the stacked structure, sidewalls of the channel holes CHH may not be perpendicular to an upper surface of the substrate 101. The channel holes CHH may be formed to partially recess the substrate 101. Next, the epitaxial layer 107 may be formed in the channel holes CHH. The epitaxial layer 107 may be formed in a selective epitaxial growth (SEG) process. The epitaxial layer 107 may be formed as a single layer or a plurality of layers. The epitaxial layer 107 may include, for example, polysilicon, single crystalline silicon, polycrystalline germanium, or single crystalline germanium, doped or undoped with impurities.

Figure 10C:
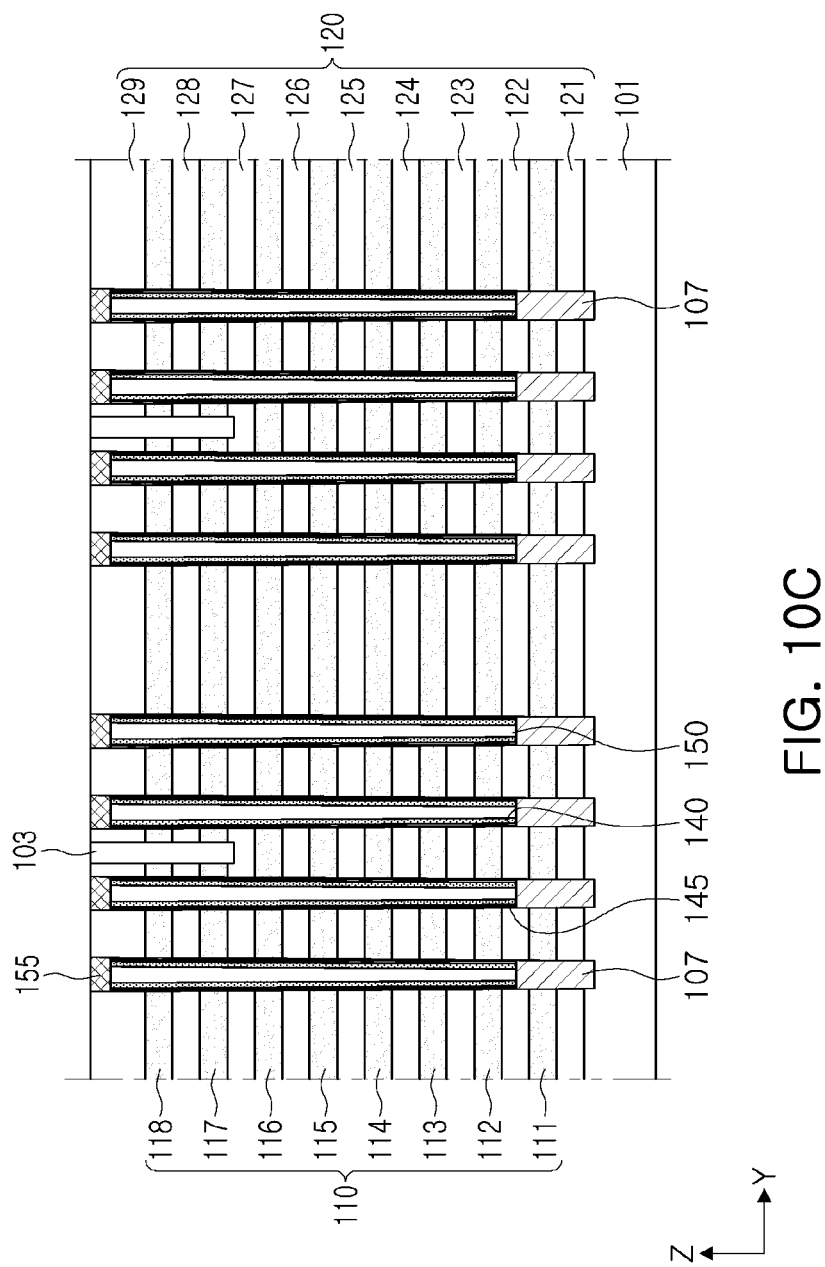

Referring to FIG. 10C, channels CH may be formed in the channel holes CHH by forming a gate dielectric layer 145, a channel area 140, a channel insulating layer 150, and a channel pad 155.

The gate dielectric layer 145 may be formed to have a uniform thickness using an atomic layer deposition (ALD) process or a chemical vapor deposition (CVD) process. In the process, all or a portion of the gate dielectric layer 145 may be formed. For example, a portion extending perpendicularly to the substrate 101 along the channel holes CHH may be formed in the process.

The channel area 140 may be formed in the channel holes CHH disposed on the gate dielectric layer 145. The channel insulating layer 150 may be formed to fill the channel holes CHH and formed of an insulating material. However, in some example embodiments, a conductive material may fill a space between the channel areas 140 in the channel holes CHH, instead of the channel insulating layer 150. The channel pad 155 may be formed of a conductive material, such as polysilicon.

Figure 10D:
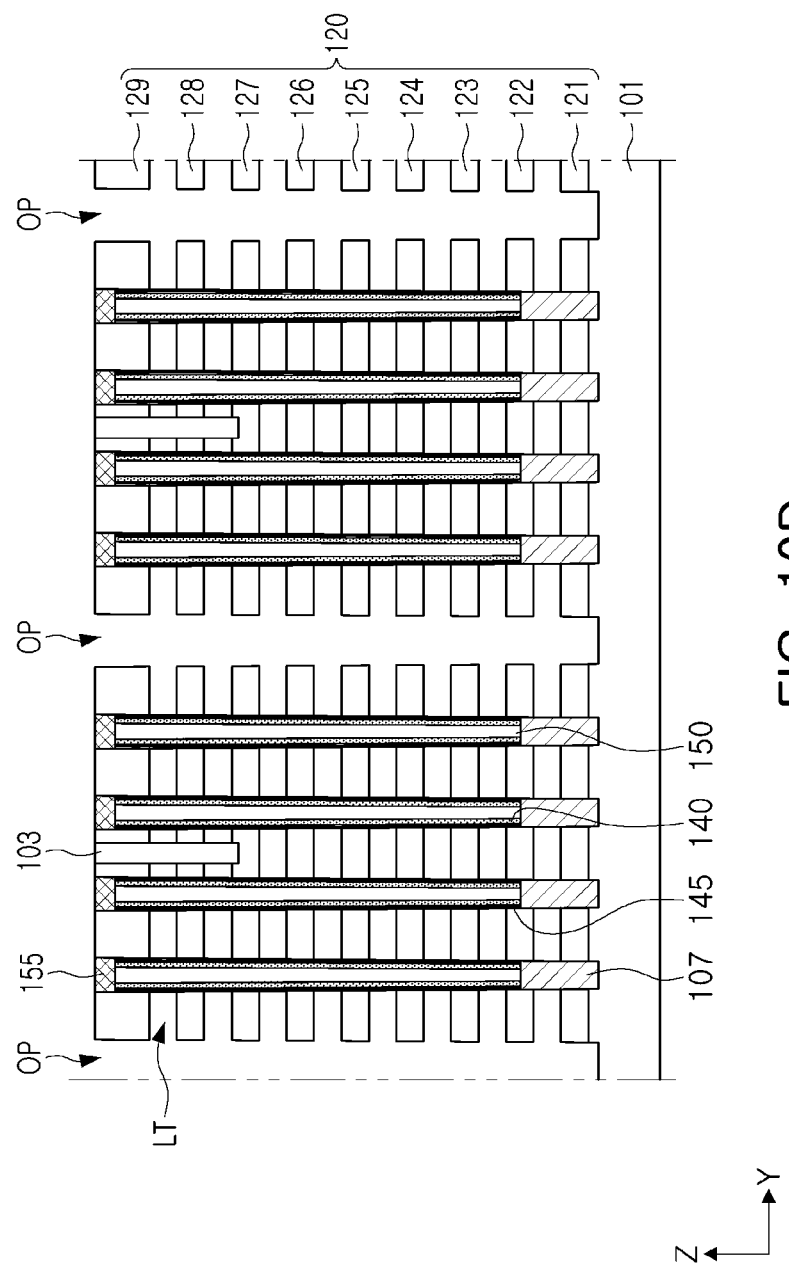

Referring to FIG. 10D, an opening area OP separating the stacked structure of the sacrificial layers 110 and the interlayer insulating layers 120 at predetermined intervals may be formed, and lateral openings LT may be formed by removing the sacrificial layers 110 exposed in the opening area OP.

In some example embodiments, damage of the channel pad 155 and the channel area 140 disposed below the channel pad 155 may be prevented by forming an additional insulating layer on the uppermost interlayer insulating layer 129 and the channel pad 155 before forming the opening area OP. The opening area OP may be formed by forming a mask layer using a photolithography process and anisotropically etching the stacked structure of the sacrificial layers 110 and the interlayer insulating layers 120. The opening area OP may be formed in a trench shape extending in the x-direction (see FIG. 4), and arranged in an area in which the conductive layer 165 and the separation insulating layer 160 illustrated in FIG. 4 is to be formed.

The sacrificial layers 110 may be selectively removed with respect to the interlayer insulating layers 120 in a wet etching process, for example. Accordingly, a plurality of lateral openings LT may be formed between the interlayer insulating layers 120, and portions of the gate dielectric layer 145 in the channels CH, for example, sidewalls extending perpendicularly to the substrate 101 along the channels CH, may be exposed through the lateral openings LT.

Figure 10E:
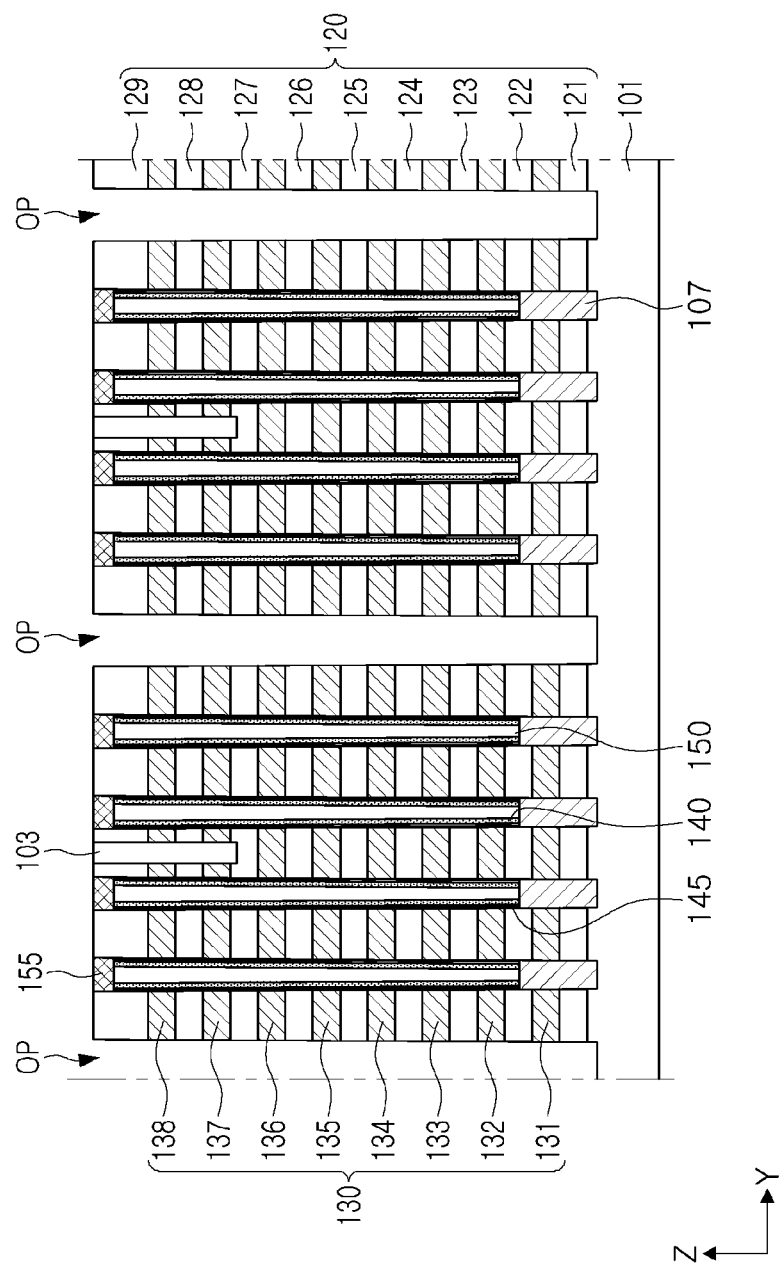

Referring to FIG. 10E, the gate electrodes 130 may be formed in the lateral openings LT.

The gate electrodes 130 may include, for example, a metal, polysilicon, or a metal silicide. After the gate electrodes 130 are formed, materials configuring the gate electrodes 130, formed in the opening area OP, may be removed in an additional process so that the gate electrodes 130 are disposed only in the lateral openings LT. In some example embodiments, the interlayer insulating layer 120 may protrude toward the opening area OP further than the gate electrodes 130 protrude.

Figure 10F:
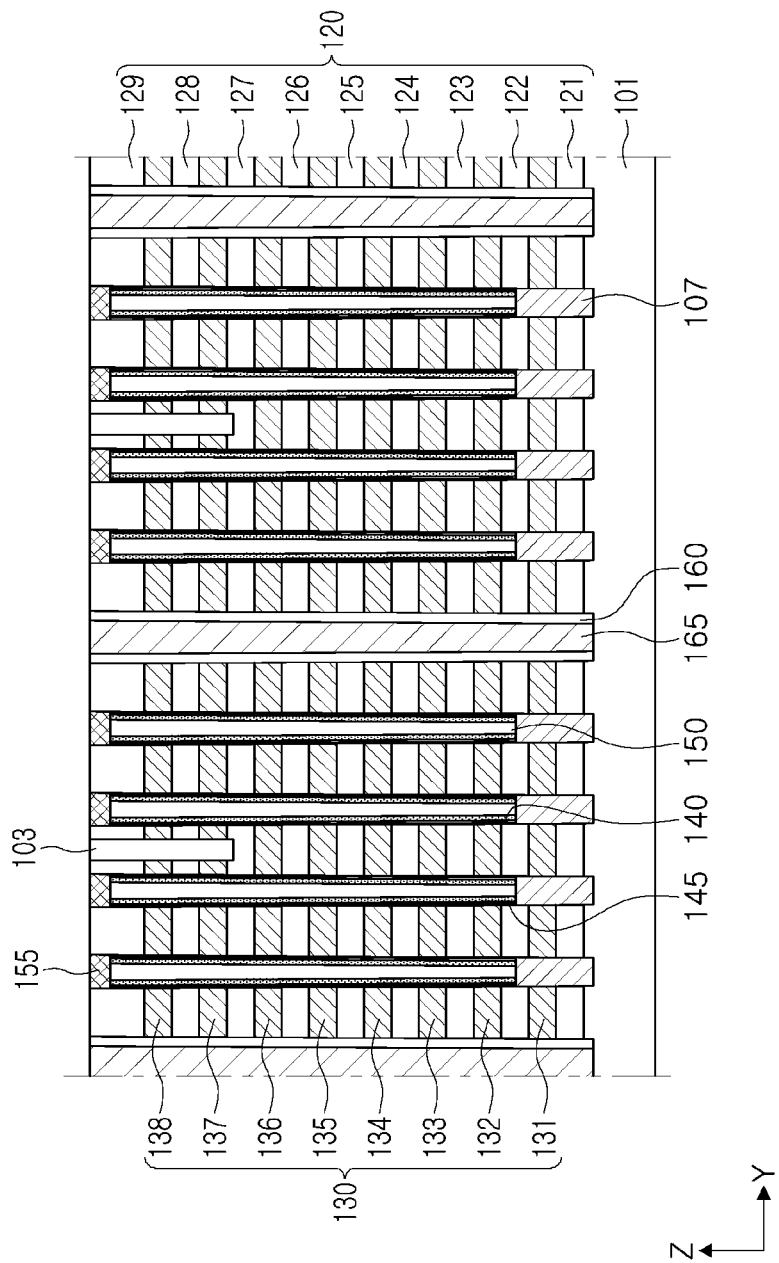

Referring to FIG. 10F, a separation area SA including a separation insulating layer 160 and a conductive layer 165 is formed in the opening area OP.

The separation insulating layer 160 may be formed to have a spacer shape by forming an insulating material and removing the insulating material on the substrate 101 until the upper surface of the substrate 101 is exposed. The conductive layer 165 may be formed by depositing a conductive material in the separation insulating layer 160. The gate electrodes 130 may be spaced apart from each other at predetermined intervals in the y-direction by the separation area SA, and gate stack structures may be formed and separated by the separation area SA.

Figure 10G:
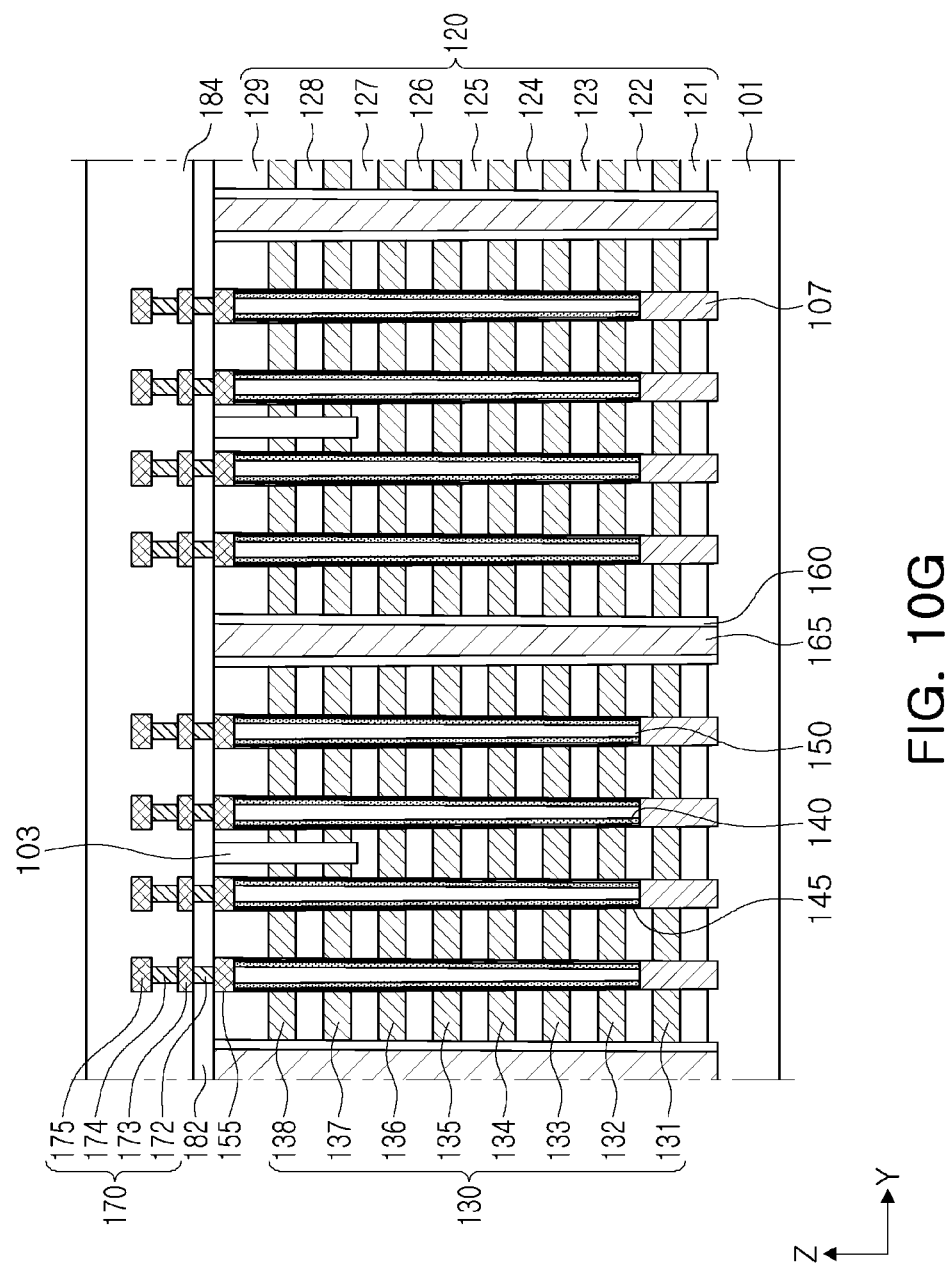

Referring to FIG. 10G, first and second upper insulating layers 182 and 184 and interconnection layers 170 may be formed on the channels CH.

Among the interconnection layers 170, channel plugs 172 and first plugs 174 may be formed by partially forming the first and second upper insulating layers 182 and 184, partially etching the first and second upper insulating layers 182 and 184, and filling a conductive material in the etched portion of the first and second upper insulating layers 182 and 184. Bit lines 173 and first interconnection line 175 may be formed by, for example, depositing a conductive material and patterning the conductive material. Additional interconnection structures connected to the channel pads 155 and the channel plugs 172 may be formed below the bit lines 173, and the bit lines 173 may be extended in the y-direction above the additional structures.

Figure 10H:
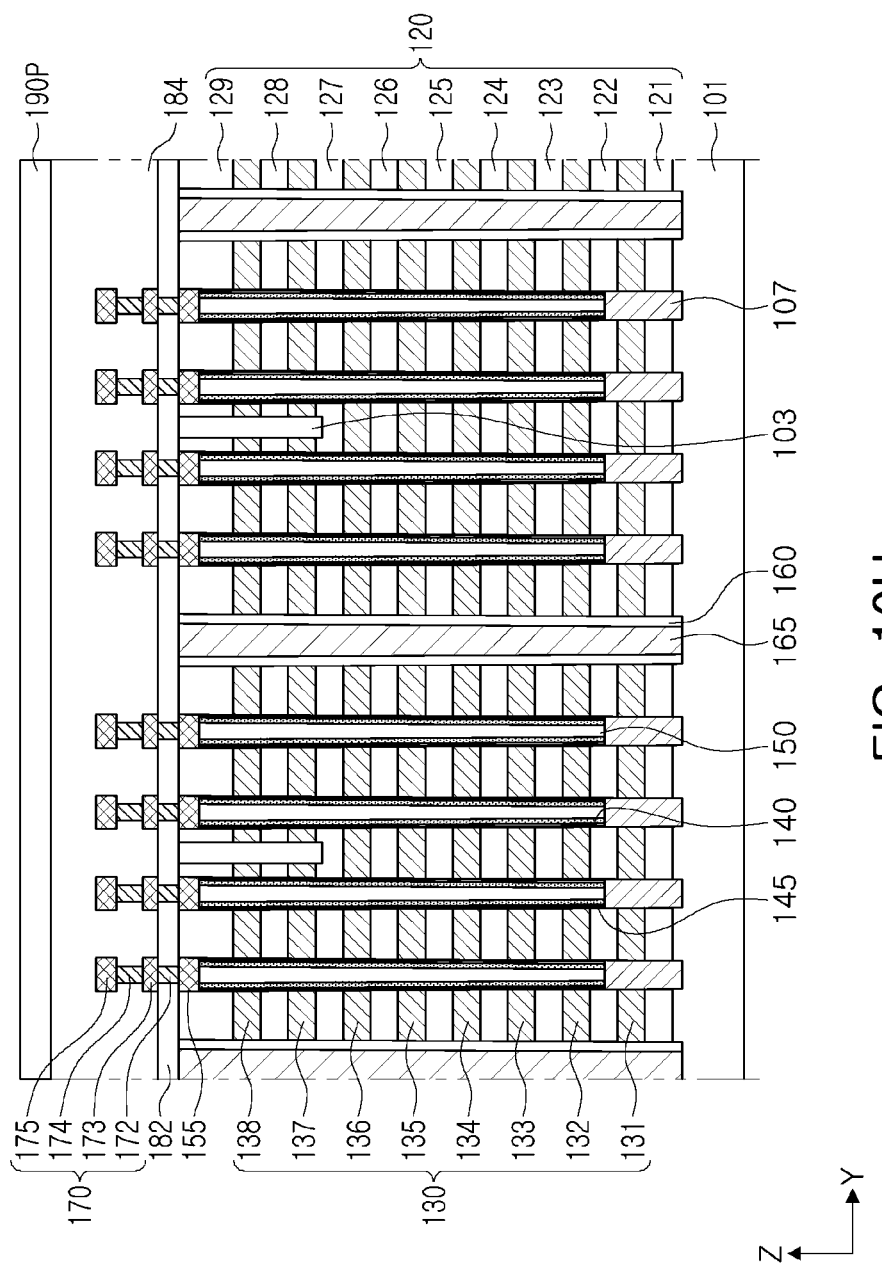

Referring to FIG. 10H, a preliminary passivation layer 190P is formed on the second upper insulating layer 184.

The preliminary passivation layer 190P may be formed to have the same thickness as one having a greater thickness among the first and second line patterns 192 and 194 configuring a passivation layer 190 in a subsequent process. The preliminary passivation layer 190P may be formed of silicon nitride or plasma enhanced SiN (PE-SiN), for example.

Figure 10I:
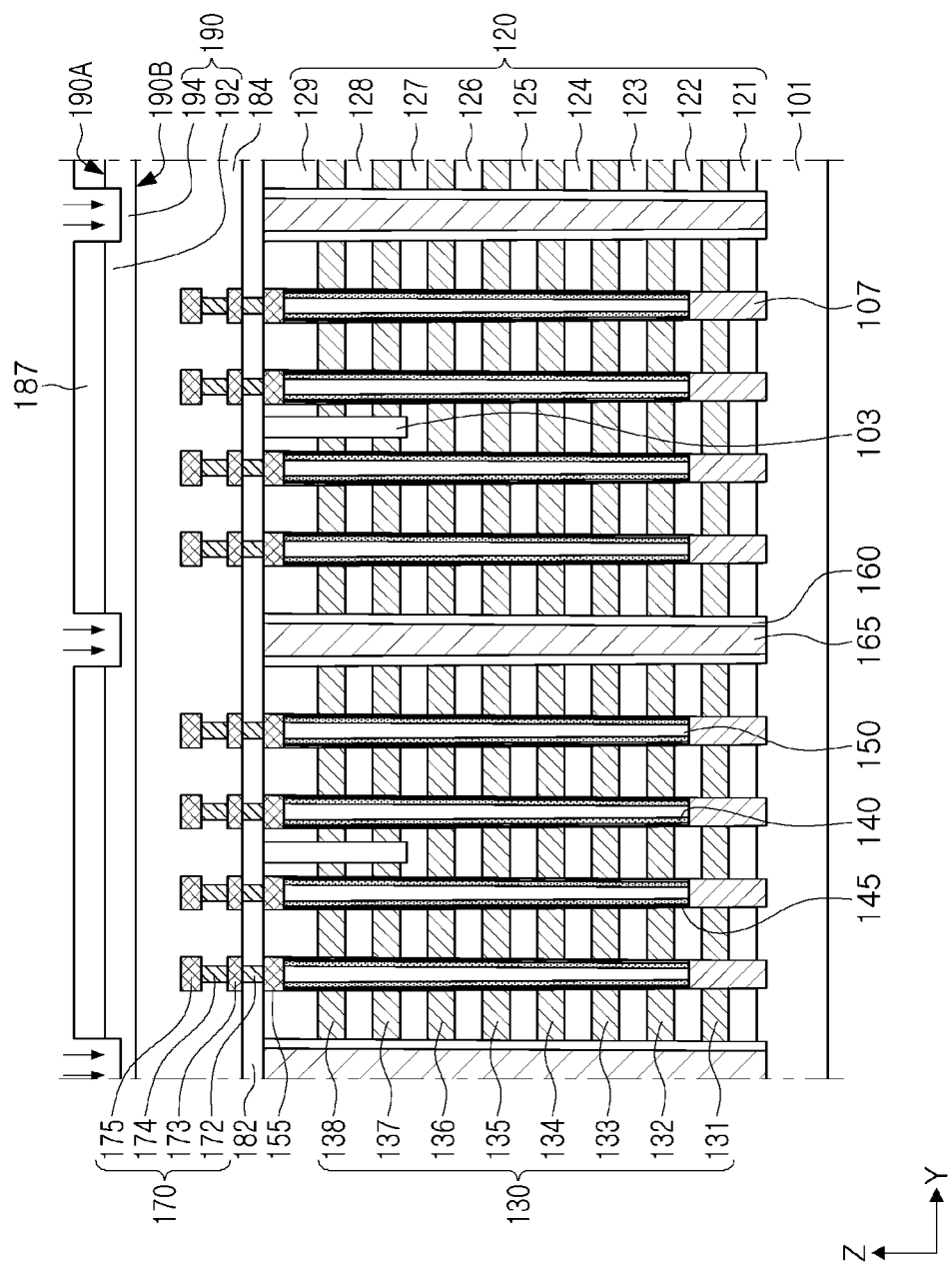

Referring to FIG. 10I, first and second line patterns 192 and 194 may be formed by partially removing the preliminary passivation layer 190P.

For example, a mask layer 187 may be formed on the preliminary passivation layer 190P and then the preliminary passivation layer 190P exposed by the mask layer 187 may be removed by a predetermined thickness. The preliminary passivation layer 190P may be removed in a dry etching process, for example, and a thickness of the preliminary passivation layer 190P etched in the process may be adjusted by controlling etching time.

The first line patterns 192 may be formed below the mask layer 187 where the preliminary passivation layer 190P is not removed, and the second line patterns 194 may be formed in a region in which the preliminary passivation layer 190P is partially removed. Thus, the passivation layer 190 may be formed.

The process of fabricating the passivation layer 190 described above with reference to FIGS. 10H and 10I may be variously modified in various example embodiments. For example, in some example embodiments, the second line patterns 194 and a lower layer 192L (see FIG. 4) of the first line patterns 192 may be formed first, and an upper layer 192U (see FIG. 4) of the first line patterns 192 may be patterned thereon.

Figure 10J:
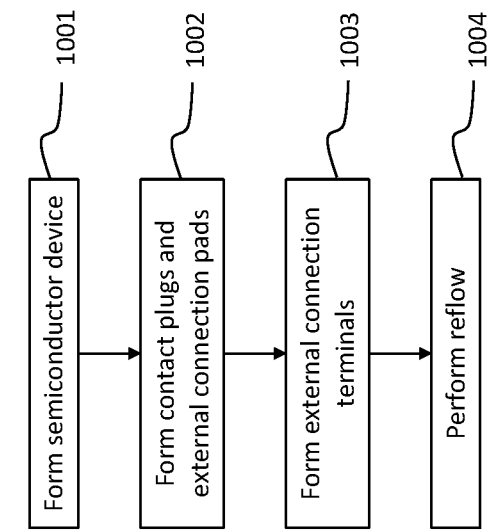
FIG. 10J is a flow chart describing a method of manufacturing a semiconductor device according to example embodiments of the inventive concept.

FIG. 10J is a flowchart describing subsequent processes used to form a semiconductor device, such as a memory device. For example, step 1001 represents the above method 10A to 10I of forming a semiconductor device. External connection terminals may then be formed on the semiconductor device formed from the process shown in FIGS. 10A to 10I. For example, in step 1002, contact plugs, also described as conductive plugs, may be formed through various insulating layers to have one end connected to an integrated circuit component, such as a contact area CP of a gate electrode shown in FIG. 9, and another end connected to an external connection pad, such as a connection pad formed at an upper surface of the semiconductor device (e.g., at a surface of the passivation layer). In step 1003, external connection terminals, such as solder bumps or solder balls formed of a solder material, may be formed on the connection pads. Then, in step 1004, a reflow process is performed, and the solder bumps or balls are heated in order to reflow the solder and connect the solder bumps or balls to another device. This heating may cause warpage of the semiconductor device, for example, according to the various embodiments described herein.

Therefore, in the manner described above, a method of manufacturing a 3-dimensional semiconductor memory device can include providing a semiconductor substrate extending horizontally in a first direction and a second direction crossing the first direction, forming a stacked memory cell array on the semiconductor substrate, and forming a separation pattern including separation lines extending in the first direction and arranged in the second direction. The separation lines divide the stacked memory cell array into a plurality of memory cell structures extending in the first direction and arranged in the second direction. An upper insulating layer may be formed above the plurality of memory cell structures and separation lines. In addition, a passivation layer may be formed above the upper insulating layer. The passivation layer includes a plurality of first regions having a first vertical thickness. A plurality of gap regions are formed between the plurality of first regions, and the plurality of first regions vertically overlap the plurality of memory cell structures, while the plurality of gap regions vertically overlap the plurality of separation lines.

In one embodiment, forming the passivation layer and the plurality of gap regions may include forming a continuous layer to cover the upper insulating layer, and removing portions of the continuous layer to form the gap regions. Furthermore, removing portions of the continuous layer may include removing portions of the continuous layer that include only part of the entire vertical thickness of the continuous layer to form line patterns in the passivation layer.

A plurality of external connection pads and external connection terminals that connect to various components, such as word lines of the 3-dimensional memory device, may be formed, for example at the passivation layer. For example, external connection pads may connect to various circuit elements through conductive plugs that pass through an insulating layer of the semiconductor device. Solder balls or bumps may be connected to the external connection pads.

As a result, a plurality of solder bumps or balls may be connected to a plurality of external connection pads at an external surface of the semiconductor device. A reflow process may be performed to heat and reflow the solder bumps, causing warpage of the 3-dimensional semiconductor device in both the first direction and the second direction. The warping may be controlled based on the pattern formed from the passivation layer, according to one or more of the various embodiments described herein.

Figure 11:
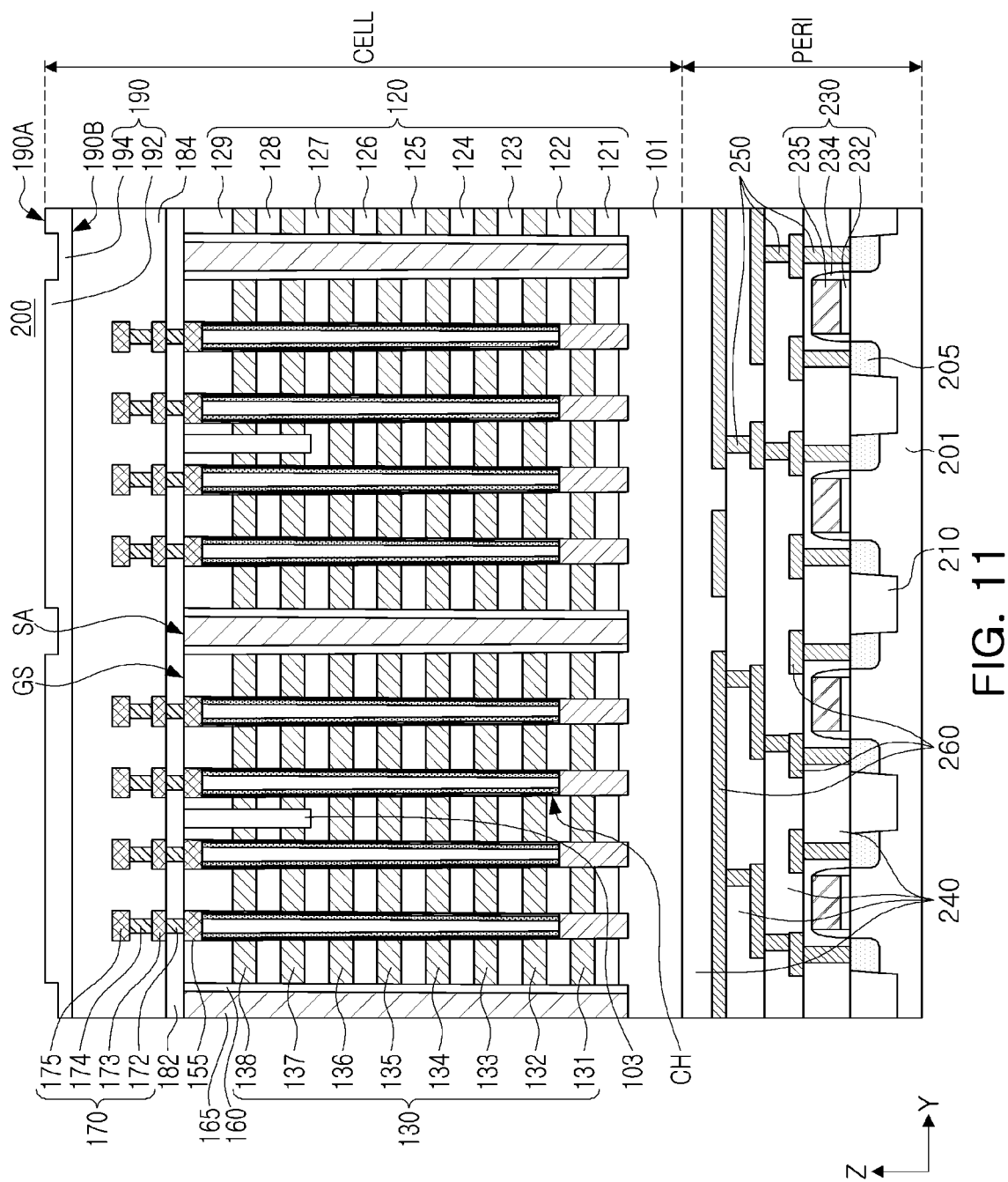
FIG. 11 is a schematic cross-sectional view illustrating a semiconductor device according to example embodiments of the inventive concept.

FIG. 11 is a schematic cross-sectional view illustrating a semiconductor device according to example embodiments of the present inventive concept.

Referring to FIG. 11, a semiconductor device 200 may include a memory cell region CELL and a peripheral circuit region PERI. The memory cell region CELL may be arranged on the peripheral circuit region PERI. In some example embodiments, the memory cell region CELL may be arranged above the peripheral circuit region PERI.

The memory cell region CELL may include a substrate 101, gate electrodes 130 stacked on the substrate 101, channels CH passing through the gate electrodes 130, separation areas SA extending through the gate electrodes 130, interconnection layers 170 electrically connected to the gate electrodes 130 and the channels CH, and a passivation layer 190 arranged on top, as described with reference to FIGS. 3 and 4. The memory cell region CELL of the semiconductor device 200 may further include interlayer insulating layers 120 stacked alternately with the gate electrodes 130 on the substrate 101 to form a gate stack structure GS, a conductive layer 165 and separation insulating layer 160 forming separation areas SA, channel areas 140 disposed in the channels CH, and first and second upper insulating layers 182 and 184. The memory cell region CELL may have various structures described above with reference to FIGS. 3 to 9.

The peripheral circuit region PERI may include a base substrate 201, circuit devices 230 arranged on the base substrate 201, and circuit contact plugs 250 and interconnection lines 260.

The base substrate 201 may include active regions defined by device isolation layers 210. Source/drain areas 205 containing impurities may be formed in portions of the active regions. The base substrate 201 may include a semiconductor material, such as a Group IV semiconductor material, a Group III-V compound semiconductor material, or a Group II-VI oxide semiconductor material.

The circuit devices 230 may include planar transistors. Each of the circuit devices 230 may include a circuit gate insulating layer 232, a spacer layer 234, and a circuit gate electrode 235. Source/drain areas 205 may be formed in the base substrate 201 disposed on both sides of the circuit gate electrode 235.

A plurality of peripheral insulating layers 240 may be formed above the circuit devices 230 on the base substrate 201. The circuit contact plugs 250 may pass through the peripheral insulating layers 240 to be connected to the source/drain areas 205. By virtue of the circuit contact plugs 250, an electrical signal may be applied to the circuit devices 230. In a region not illustrated in the drawings, the circuit contact plugs 250 may also be connected to the circuit gate electrode 235. The interconnection lines 260 may be connected to the circuit contact plugs 250 and may be arranged in a plurality of layers.

The semiconductor device 200 may be manufactured by forming the peripheral circuit region PERI first, then forming the substrate 101 of the memory cell region CELL on the peripheral circuit region PERI, and then forming the memory cell region CELL. The substrate 101 may have the same size as the base substrate 201 or a smaller size than the base substrate 201.

Figure 12:
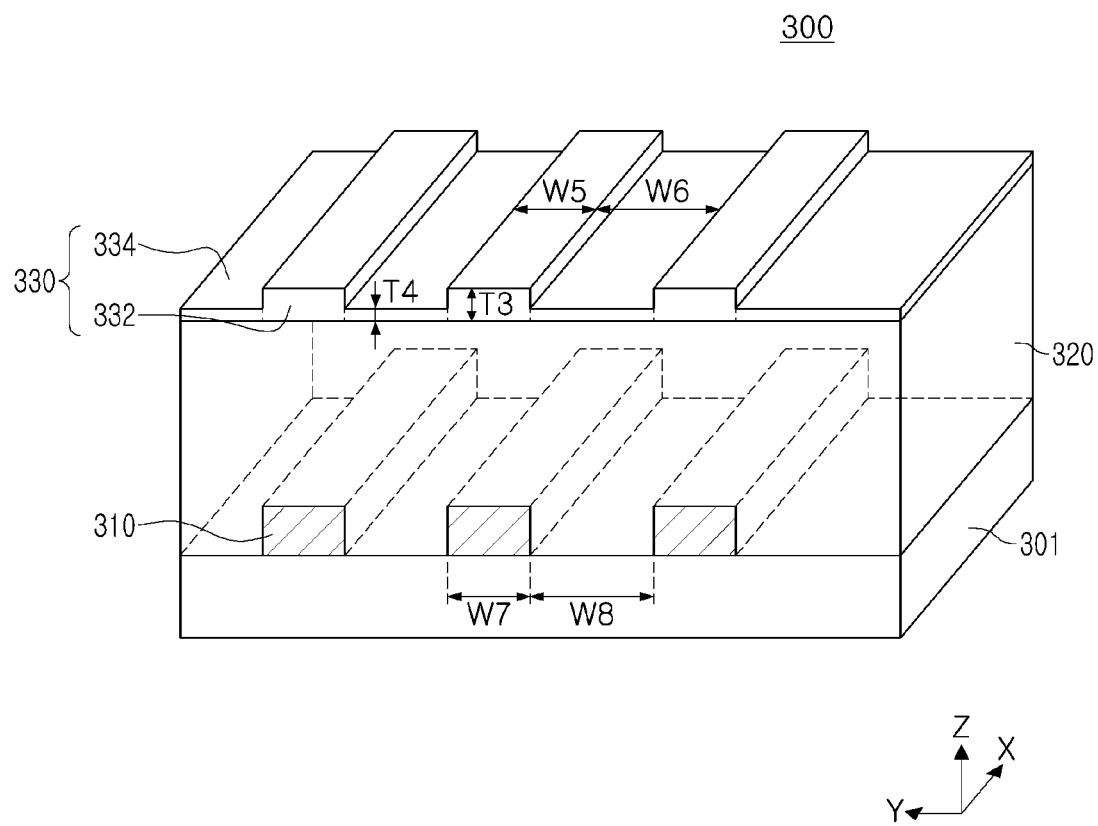
FIG. 12 is a schematic perspective view illustrating a semiconductor device according to example embodiments of the inventive concept.

FIG. 12 is a schematic perspective view illustrating a semiconductor device according to example embodiments of the present inventive concept.

Referring to FIG. 12, a semiconductor device 300 may include a substrate 301, patterns 310 arranged on the substrate 301, an insulating layer 320 covering the patterns 310, and a passivation layer 330 arranged on the insulating layer 320.

The substrate 301 may be a semiconductor substrate or include a semiconductor substrate and circuit devices formed on the semiconductor substrate.

The patterns 310 may extend in the x-direction to be spaced apart from each other in the y-direction. The patterns 310 may configure an active region or a conductive line of the semiconductor device 300. The conductive line may include, for example, a word line or a bit line. Sizes and arrangement of the patterns 310 may be variously modified according to the type of semiconductor device 300. The patterns 310 may apply tensile stress or compressive stress to the substrate 301. The patterns 310 may apply anisotropic stress to the substrate 301. For example, since the patterns 310 are arranged to be spaced apart from each other in the y-direction, at least a portion of the stress applied in the y-direction may be released. However, since the patterns 310 are continuously extended in the x-direction, the stress in the x-direction may be applied to the substrate 301. Accordingly, the amount and/or type of the stress applied to the substrate 301 in the x-direction by the patterns 310 may be different from those in the y-direction.

The insulating layer 320 may be arranged between the patterns 310 and the passivation layer 330. Circuit devices and/or interconnection layers connected to the patterns 310 may further be arranged in the insulating layer 320.

The passivation layer 330 may be arranged above the circuit devices of the semiconductor device 300 including the patterns 310 and interconnection layers connected to the circuit devices, and insulated from the circuit devices and the interconnection layers. The passivation layer 330 may apply tensile or compressive stress to the substrate 301. The stress applied by the passivation layer 330 may be different from the stress applied by the patterns 310. Accordingly, the passivation layer 330 may release the stress applied to the substrate 301 and/or upper layers by the patterns 310. In particular, when the anisotropic stress is applied to the semiconductor device 300 by lower layers including the patterns 310, the passivation layer 330 may also be arranged to apply anisotropic stress so as to reduce net stress. Accordingly, the passivation layer 330 may include first and second line patterns 332 and 334 extending and arranged alternately in the y-direction.

The first and second line patterns 332 and 334 may have a line shape extending in the same x-direction as the patterns 310. The first and second line patterns 332 and 334 may have different thicknesses from each other. The first and second line patterns 332 and 334 may have different widths from each other in the y-direction. The first line patterns 332 may have a third thickness T3, and the second line patterns 334 may have a fourth thickness T4 smaller than the third thickness T3. The first line patterns 332 may have a fifth width W5 and the second line patterns 334 may have a sixth width W6 the same as or different from the fifth width W5.

A seventh width W7 of each of the patterns 310 may be the same as or different from an eighth width W8, a distance between the patterns 310. A ratio (W7/W8) of the seventh width W7 to the eighth width W8 may be the same as or similar to a ratio (W5/W6) of the fifth width W5 to the sixth width W6, but is not limited thereto. For example, even when ratio (W5/W6) of the fifth width W5 to the sixth width W6 is different from the ratio (W7/W8) of the seventh width W7 to the eighth width W8, the stress applied to the semiconductor device 300 may be released by adjusting the difference between the third thickness T3 and the fourth thickness T4.

Accordingly, the occurrence of warpage of the semiconductor device 300 may be minimized by adjusting relative thicknesses and widths of the first and second line patterns 332 and 334 configuring the passivation layer 330 according to the amount and/or type of the stress applied by patterns 310.

Figure 16:
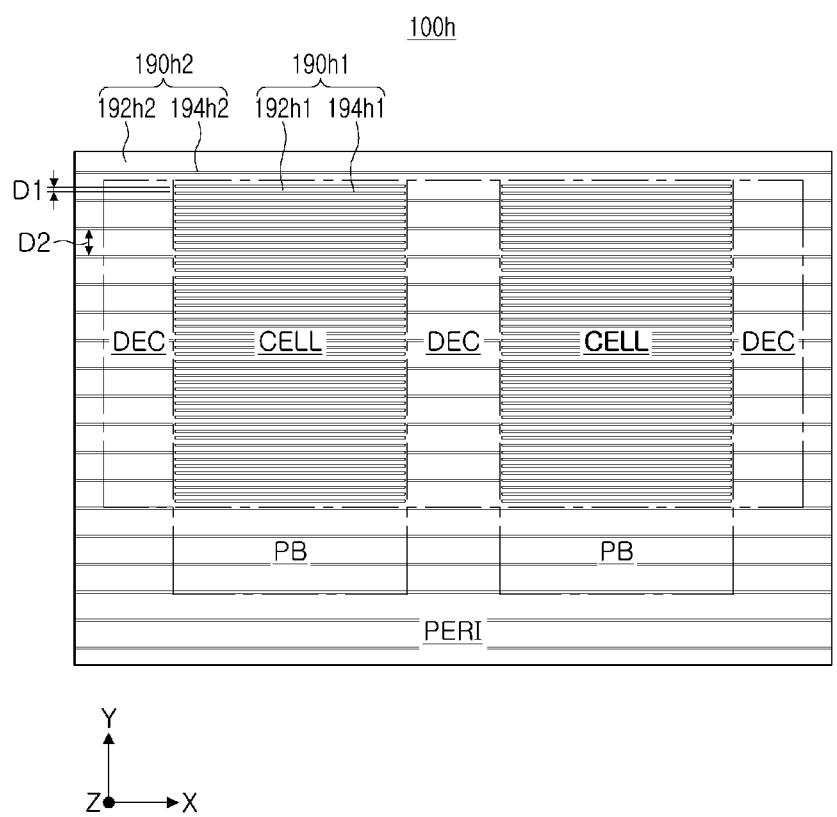
Figure 17:
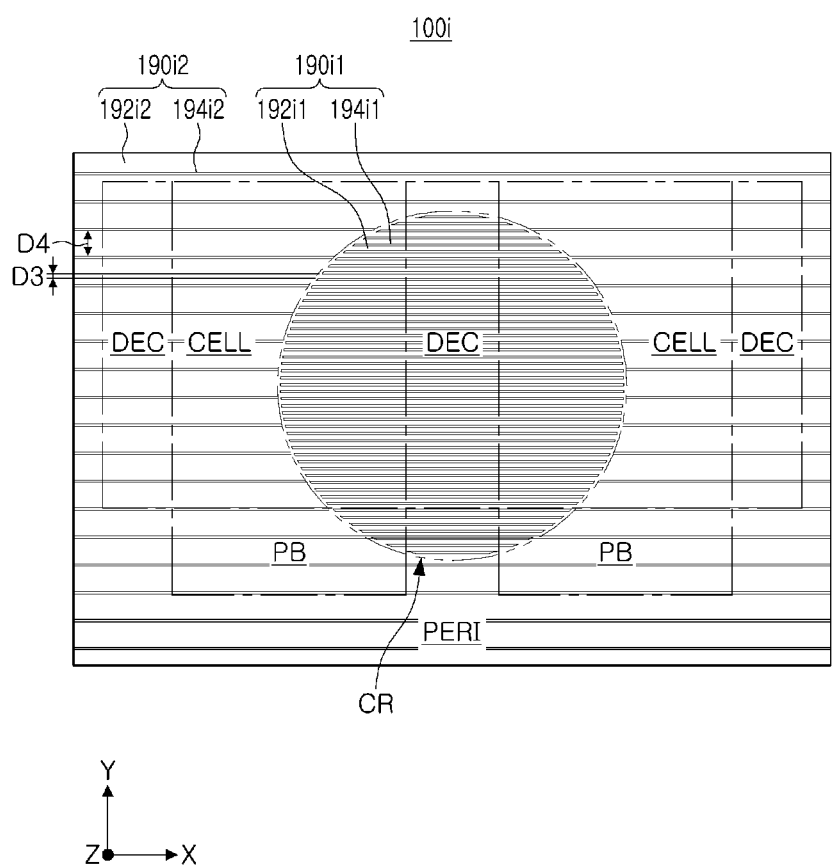

FIGS. 16 and 17 are schematic layout diagrams of a semiconductor device, according to example embodiments.

Referring to FIGS. 16 and 17, semiconductor devices 100h and 100i may include at least two regions including a memory cell region CELL, a row decoder region DEC, a page buffer region PB, and another circuit region PERI, which form a peripheral circuit region.

The memory cell region CELL may be a region in which the memory cell array 20 described above with reference to FIG. 1 is disposed. The row decoder region DEC may have the row decoder 32 of FIG. 1 disposed therein. The page buffer region PB may have the page buffer 34 of FIG. 1 disposed therein. The other circuit region PERI may have other circuits, including the control circuit 36 of FIG. 1, disposed therein. The arrangement relationships of the respective regions illustrated in FIGS. 16 and 17 are provided by way of example, but an arrangement of the respective regions is not limited thereto.

According to certain embodiments, the row decoder region DEC may be disposed on at least one side of the memory cell region CELL in one direction thereof, for example, an x direction. The page buffer region PB may be disposed on at least one side of the memory cell region CELL in one direction thereof, for example, in a y direction. Thus, the word lines WLs (refer to FIG. 1) may extend in the x direction from the memory cell region CELL toward the row decoder region DEC, and the bit lines BLs (refer to FIG. 1) may extend in the y direction from the memory cell region CELL toward the page buffer region PB. The other circuit region PERI may be disposed in the vicinity of the memory cell region CELL, the row decoder region DEC, and the page buffer region PB, and an I/O circuit, a high voltage generating circuit, a circuit for testing, or the like may be disposed in the other circuit region PERI.

Referring to FIG. 16, passivation layers 190$h$1 and 190$h$2 of a semiconductor device 100$h$ may include first line patterns 192$h$1 and 192$h$2 and second line patterns 194$h$1 and 194$h$2. The first line patterns 192$h$1 and 192$h$2 may be arranged on entire regions of the semiconductor device 100$h$ except regions in which the second line patterns 194$h$1 and 194$h$2 are arranged, and the second line patterns 194$h$1 and 194$h$2 may be arranged at different densities in at least two regions. The second line patterns 194$h$1 and 194$h$2 may have a smaller thickness in the vertical direction than the first line patterns 192$h$1 and 192$h$2, similar to the patterns 192 and 194 discussed previously. Also, as can be seen in FIG. 16, the second line patterns 194$h$1 in the memory cell regions CELL may be disposed at a higher density than the second line patterns 194$h$2 disposed in other regions, including the row decoder region DEC, the page buffer region PB, and the other circuit region PERI. A distance D1 between adjacent second line patterns 194$h$1 may be smaller than a distance D2 between adjacent second line patterns 194$h$2. In some embodiments, the second line patterns 194$h$2 may be omitted and the second line patterns 194$h$1 may be disposed in the memory cell regions CELL only. In some embodiments, widths of the second line patterns 194$h$1 and 194$h$2 may be different from each other.

Referring to FIG. 17, passivation layers 190$i$ of a semiconductor device 100$i$ may include first line patterns 192$i$1 and 192$i$2 and second line patterns 194$i$1 and 194$i$2. The first line patterns 192$i$1 and 192$i$2 may be arranged on entire regions of the semiconductor device 100$i$ except regions in which the second line patterns 194$i$1 and 194$i$2 are arranged. The second line patterns 194$i$1 and 194$i$2 may have a smaller thickness in the vertical direction than the first line patterns 192$i$1 and 192$i$2, similar to the patterns 192 and 194 discussed previously. Also, as can be seen in FIG. 17, the second line patterns 194$i$1 and 194$i$2 may be arranged at different densities in at least two regions including a center region CR and the other region except the center regions CR. The center region CR may be positioned on a center of the semiconductor device 100$i$. For example, the second line patterns 194$i$1 in the center regions CR may be disposed in a higher density than the second line patterns 194$i$2 disposed in the other region. On the contrary, in some example embodiment, the second line patterns 194$i$1 in the center regions CR may be arranged in a lower density than the other region except the center region CR. A distance D3 between adjacent second line patterns 194$i$1 may be smaller than a distance D4 between adjacent second line patterns 194$i$2. Such arrangements of the second line patterns 194$i$1 and 194$i$2 may be determined considering anisotropic stress applied to the semiconductor device 100$i$ and warpage type of the semiconductor device 100$i$. In some embodiments, the second line patterns 194$i$2 may be omitted and the second line patterns 194$i$1 may be disposed in the center region CR only. In some embodiments, widths of the second line patterns 194$i$1 and 194$i$2 may be different from each other.

As described above with referring to FIGS. 16 and 17, the second line patterns 194$h$1, 194$h$2, 194$i$1 and 194$i$2 may be arranged at different densities in different regions of the semiconductor devices 100$h$ and 100$i$ according to structures and resulting warpage of the semiconductor devices 100$h$ and 100$i$.

More specifically, in FIGS. 16 and 17, an example semiconductor device includes a control region (e.g., the row decoder region DEC, the page buffer region PB, and the other circuit region PERI) outside a stacked memory cell array (CELL). The control region may include the passivation layer. The passivation layer in at least part of the cell region includes a plurality of first regions (e.g., 192$h$1 in FIG. 16 or 192$i$1 in FIG. 17) having a first vertical thickness and a plurality of gap regions (e.g., 194$h$1 in FIG. 16 or 194$i$1 in FIG. 17) formed between the plurality of first regions. The passivation layer in at least part of the control region includes a second plurality of first regions (e.g., 192$h$2 in FIG. 16 or 192$i$2 in FIG. 17) having the first vertical thickness and a second plurality of gap regions (e.g., 194$h$2 in FIGS. 16 and 194$i$2 in FIG. 17) formed between the second plurality of first regions. An additional stacked memory cell array (CELL) may be horizontally separate from the stacked memory cell array. A first portion of a control region (e.g., a central DEC region) may be between the stacked memory cell array and the additional stacked memory cell array. A second portion of the control region may be outside of the stacked memory cell array and the additional memory cell array and not between the stacked memory cell array and the additional memory cell array. As can be seen in FIGS. 16 and 17, a density of the second plurality of gap regions is smaller than a density of the plurality of gap regions that overlap the plurality of separation lines. In addition, as shown in FIG. 17, in one embodiment, the plurality of gap regions that overlap the plurality of separation lines is formed over the stacked memory cell array, the additional stacked memory cell array, and the first portion of the control region.

As set forth above, a semiconductor device according to the example embodiments of the present inventive concept may have improved reliability by providing a passivation layer patterned to correspond to gate electrodes.

While example embodiments have been shown and described above, it will be apparent to those skilled in the art that modifications and variations could be made without departing from the scope of the present invention as defined by the appended claims.

What is claimed is:
1. A 3-dimensional semiconductor memory device comprising:
  a semiconductor substrate extending horizontally in a first direction and a second direction crossing the first direction;
  a stacked memory cell array formed on the semiconductor substrate;

a separation pattern including a plurality of separation lines extending in the first direction and arranged in the second direction, and dividing the stacked memory cell array into a plurality of memory cell structures extending in the first direction and arranged in the second direction;

an upper insulating layer formed above the plurality of memory cell structures and separation lines; and a passivation layer formed above the upper insulating layer, wherein:

the passivation layer includes a plurality of first regions having a first vertical thickness, a plurality of gap regions in the passivation layer are formed between the plurality of first regions, and the plurality of gap regions extend in the first direction.

2. The semiconductor memory device of claim 1, wherein:

the plurality of gap regions comprise a plurality of second regions of the passivation layer having a second vertical thickness different from the first vertical thickness.

3. The semiconductor memory device of claim 2, wherein:

the stacked memory cell array is a vertical NAND memory cell array, and the plurality of memory cell structures are a plurality of gate stack structures each including a plurality of gate electrode layers alternately formed with a plurality of interlayer insulating layers on the substrate in a vertical stack.

4. The semiconductor memory device of claim 2, wherein:

the first regions combined with the second regions are arranged to reduce warpage of the semiconductor memory device in the first direction and to reduce warpage of the semiconductor memory device in the second direction.

5. The semiconductor memory device of claim 4, wherein:

the first regions combined with the second regions reduce warpage in the first direction by a greater amount than the first regions combined with the second regions reduce warpage in the second direction.

6. The semiconductor memory device of claim 2, wherein:

the first vertical thickness is larger than the second vertical thickness.

7. The semiconductor device of claim 6, wherein:

a ratio of the first vertical thickness to the second vertical thickness is between 5:3 and 5:4.

8. The semiconductor memory device of claim 1, wherein:

the stacked memory cell array is a vertical NAND memory cell array, and the plurality of memory cell structures are a plurality of gate stack structures each including a plurality of gate electrode layers alternately formed with a plurality of interlayer insulating layers on the substrate in a vertical stack; and the first regions combined with the gap regions are arranged to reduce warpage of the semiconductor memory device in the first direction and to reduce warpage of the semiconductor memory device in the second direction.

9. The semiconductor memory device of claim 1, wherein:

the passivation layer includes:

a first surface that is continuous and that is flat or curved; and a second surface opposite the first surface and that has a step shape.

10. The semiconductor memory device of claim 1, wherein:

the first regions are first line patterns extending in the first direction and having a first width in the second direction, and the gap regions are second line patterns extending in the first direction that have a smaller vertical thickness than the first regions and that have a second width in the second direction, the second width being smaller than the first width.

11. A 3-dimensional semiconductor memory device comprising:

a semiconductor substrate extending horizontally in a first direction and a second direction crossing the first direction;

a stacked memory cell array formed on the semiconductor substrate;

a separation pattern including a plurality of separation lines extending in the first direction and arranged in the second direction, and dividing the stacked memory cell array into a plurality of memory cell structures extending in the first direction and arranged in the second direction;

an upper insulating layer formed above the plurality of memory cell structures and separation lines; and a passivation layer formed above the upper insulating layer, wherein:

the passivation layer includes a plurality of first regions having a first vertical thickness, a plurality of gap regions in the passivation layer are formed between the plurality of first regions, the plurality of first regions vertically overlap the plurality of memory cell structures, and the plurality of gap regions vertically overlap the plurality of separation lines, the plurality of gap regions comprise a plurality of second regions of the passivation layer having a second vertical thickness, and a ratio of the first vertical thickness to the second vertical thickness is between 5:3 and 5:4.

12. The semiconductor device of claim 11, wherein:

a ratio of the first vertical thickness to a thickness of the semiconductor device between a top surface of the semiconductor substrate and a bottom surface of the passivation layer is between 1:25 to 1:6.

13. The semiconductor device of claim 11, wherein:

the stacked memory cell array is a vertical NAND memory cell array, and the plurality of memory cell structures are a plurality of gate stack structures each including a plurality of gate electrode layers alternately formed with a plurality of interlayer insulating layers on the substrate in a vertical stack.

14. The semiconductor device of claim 11, wherein:

two adjacent gap regions of the plurality of gap regions respectively vertically overlap two adjacent separation lines of the plurality of separation lines.

15. The semiconductor device of claim 11 wherein:

the passivation layer includes a plurality of third regions having the second vertical thickness, each third region formed between two of the second regions.

16. The semiconductor device of claim 15, wherein:

each third region vertically overlaps a string insulating layer formed in a respective gate stack structure.

17. A vertical NAND (VNAND) semiconductor device comprising:

a semiconductor substrate;

a plurality of gate electrode layers alternately formed with a plurality of interlayer insulating layers on the substrate in a vertical stack, and forming a plurality of gate stack structures extending in a first horizontal direction and separated from each other in a second horizontal direction perpendicular to the first direction;

a plurality of vertical channels passing through each of the plurality of gate stack structures, wherein the plurality of vertical channels form transistor strings;

a plurality of separation areas extending in the first horizontal direction and arranged in the second horizontal direction between the plurality of gate stack structures to separate the gate stack structures from each other;

an upper insulating layer formed above the plurality of gate electrode layers; and a passivation layer formed above the upper insulating layer, wherein:

the passivation layer includes a plurality of first regions having a first vertical thickness, a plurality of gap regions in the passivation layer are formed between the plurality of first regions, the plurality of first regions vertically overlap the plurality of gate stack structures, and the plurality of gap regions vertically overlap the plurality of separation areas, and a ratio of the first vertical thickness to a thickness of the semiconductor device between a top surface of the semiconductor substrate and a bottom surface of the passivation layer is between 1:25 to 1:6.

18. The semiconductor device of claim 17, wherein:

the plurality of gap regions comprise a plurality of second regions of the passivation layer having a second vertical thickness different from the first vertical thickness, and a ratio of the first vertical thickness to the second vertical thickness is between 5:3 and 5:4.

19. The semiconductor device of claim 17, wherein:

the passivation layer includes:

a first surface that is continuous and that is flat or curved; and a second surface opposite the first surface and that has a step shape.

20. The semiconductor device of claim 17, wherein:

the first regions are first line patterns extending in the first horizontal direction; and the gap regions are second line patterns extending in the first horizontal direction and wider in the second horizontal direction than the first line patterns.

* * * * *